United States Patent
Thornton et al.

(10) Patent No.: US 7,095,767 B1
(45) Date of Patent: Aug. 22, 2006

(54) NEAR FIELD OPTICAL APPARATUS

(75) Inventors: Robert L. Thornton, Los Altos, CA (US); Xiaolei Shi, Mountain View, CA (US)

(73) Assignee: Research Investment Network, Inc., Irvine, CA (US)

(*) Notice: Subject to any disclaimer, the term of this patent is extended or adjusted under 35 U.S.C. 154(b) by 608 days.

(21) Appl. No.: 09/650,969

(22) Filed: Aug. 29, 2000

Related U.S. Application Data
(60) Provisional application No. 60/151,492, filed on Aug. 30, 1999.

(51) Int. Cl.
*H01S 5/00* (2006.01)

(52) U.S. Cl. ............................... 372/45; 372/46
(58) Field of Classification Search ........... 372/29.021, 372/45, 46, 50
See application file for complete search history.

(56) References Cited

U.S. PATENT DOCUMENTS

| | | | |
|---|---|---|---|
| 4,460,977 A | | 7/1984 | Shimada et al. ............ 365/106 |
| 4,860,276 A | | 8/1989 | Ukita et al. ................. 369/119 |
| 5,245,622 A | * | 9/1993 | Jewell et al. .................. 372/45 |
| 5,559,773 A | | 9/1996 | Kentatsu et al. .......... 369/44.42 |
| 5,590,110 A | | 12/1996 | Sato .......................... 369/100 |
| 5,619,371 A | | 4/1997 | Pontius ...................... 359/368 |
| 5,625,617 A | | 4/1997 | Hopkins et al. ............ 369/121 |
| 5,636,190 A | | 6/1997 | Choi ....................... 369/44.23 |
| 5,696,372 A | | 12/1997 | Grober et al. .............. 250/216 |
| 5,753,941 A | * | 5/1998 | Shin et al. .................... 257/98 |
| 5,838,705 A | * | 11/1998 | Shieh et al. ................... 372/45 |
| 5,894,467 A | | 4/1999 | Wang ......................... 369/121 |
| 5,915,165 A | * | 6/1999 | Sun et al. ..................... 438/47 |
| 5,917,848 A | | 6/1999 | Claisse et al. ............... 372/96 |

(Continued)

FOREIGN PATENT DOCUMENTS

| | | |
|---|---|---|
| JP | 10143895 | 5/1998 |
| JP | 10172166 | 6/1998 |
| JP | 10255302 | 9/1998 |
| JP | 10340468 A | 12/1998 |
| JP | 63306546 A | 12/1998 |
| WO | WO 99/01277 | 1/1999 |

OTHER PUBLICATIONS

Modeling of Micro–Aperture Surface Emitting Lasers for Near–Field Optics, Koyama, et al., Oct.–'98.

(Continued)

*Primary Examiner*—David Porta
*Assistant Examiner*—Davienne Monbleau
(74) *Attorney, Agent, or Firm*—Keiji Masaki; Steve A. Wong; Caroline T. Do

(57) ABSTRACT

A near field optical apparatus comprising a conductive sheet or plane having an aperture therein, with the conductive plane including at least one protrusion which extends into the aperture. The location, structure and configuration of the protrusion or protrusions can be controlled to provide desired near field localization of optical power output associated with the aperture. Preferably, the location, structure and configuration of the protrusion are tailored to maximize near field localization at generally the center of the aperture. The aperture preferably has a perimeter dimension which is substantially resonant with the output wavelength of the light source, or is otherwise able to support a standing wave of significant amplitude. The apparatus may be embodied in a vertical cavity surface emitting layer or VCSEL having enhanced nearfield brightness by providing a conductive layer on the laser emission facet, with a protrusion of the conductive layer extending into an aperture in the emission facet. The aperture in the emission facet preferably has dimensions smaller than the guide mode of the laser, and the aperture preferably defines different regions of reflectivity under the emission facet. The depth of the aperture can be etched to provide a particular target loss, and results in higher optical power extraction from the emission facet.

48 Claims, 30 Drawing Sheets

U.S. PATENT DOCUMENTS

| | | | | |
|---|---|---|---|---|
| 5,978,408 | A | | 11/1999 | Thornton ...................... 372/96 |
| 6,061,381 | A | * | 5/2000 | Adams et al. ................. 372/96 |
| 6,084,900 | A | * | 7/2000 | Claisse et al. ................ 372/50 |
| 6,144,682 | A | * | 11/2000 | Sun .............................. 372/45 |
| 6,320,893 | B1 | * | 11/2001 | Ueki ............................. 372/96 |
| 6,365,427 | B1 | * | 4/2002 | Gauggel et al. .............. 438/22 |

OTHER PUBLICATIONS

Proposal of Ultrahigh Density Optical Disk System Using a Vertical Cavity Surface Emitting Laser Array, Kenya Goto, Jan. 19, 1998.

High Bit Rate and Tera Bytes Optical Memory in a Disk System, Kenya Goto, Japan, Spie vol. 3109.

Electron Cyclotron Resonance (ECR) Sputtered Antireflection Coatings on Laser Facets for Optical Memory Applications, Kim, et al., Japan, vol. 37, pp. 2201–2202, Apr. '98.

Near–Field Analysis of Micro–Aperture Surface Emitting Laser for High Density Optical Data Storage, Shinada, et al., vol. 6, 8–'99.

Near–Field Analysis of Micro–Aperture Surface Emitting Laser for High Density Optical Data Storage, Shinada, et al., Optical Review — vol. 6. No. 6, 8–'99.

High–power Laser Light Source for Near–Field Optics and its Application to High–Density Optical Data Storage, Partovi, et al., vol. 75, No. 11, 7–'99.

Gradient–Index Microlens formed by Ion–Beam Sputtering, Shimada, et al., Applied Optics/vol. 31, No. 25, 9–'92.

Optical Near–Field Aperture Storage Technique (ONFAST) Partovi, et al.

An Optically Accessed Memory using the Lippmann Process for Information Storage, Fleisher, et al., Performed under Government Contract No. AF33–657–11589, Aeronautical Systems Division, 1965.

High–Density Optical Recording using a solid Immersion Lens, Ichimura, et al., vol. 36, No. 19, Jul.–'97.

Optical Heads Based on Coupled–Cavity Laser Diode, Yoshitada, et al., Japan — 1916, Spie vol. 2514.

Applications of an Extremely Short Strong–Feedback Configuration of an External–Cavity Laser Diode System Fabricated with GaAs–Based Integration Technology, Ukita, et al., vol. 33, No. 24, 8–'94.

Flying Head Read/Write Characteristics using a Monolithically Integrated Laser Diode/Photodiode at a Wavelength of 1.3 µm, Ukita, et al., Spie vol. 1499, Japan — '91.

Supersmall Flying Optical Head for Phase Change Recording Media, Ukita, et al., Applied Optics/ vol. 28, No. 20, Oct.–'89.

Read/Write Performance and Reliability of a Flying Optical Head using a Monolithically Integrated LD–PD, Ukita, et al., vol. 30, No. 26, 9–'91.

Beam Converging Laser Diode by Taper Ridge Waveguide, vol. 24, No. 10, May '88.

Readout Characteristics of Micro–Optical Head Operated in Bi–Stable Mode, Ukita, et al., Japan — '87.

Near–Field Optical Data Storage, Terris, et al., No. 2, Jan. –'96.

Proposal of a Near Field Optical Head using a New Solid Immersion Mirror, Ueyanagi, et al., Japan, 7/'99.

Experiments of Novel Optical Floppy Disk Drive using Phase Change Optical Medium & Quasi–Near Field Optical Head, vol. 3864, 7/'99.

Optical Near–Field Aperture Storage Techniqaue (ONFAST) for High Density, High Performance Data Storage Applications, Afshin Partovi, vol. 3864, Jul. '99.

Optical Near–Field Probe action in Microdisk Laser with 0.12 Resolution, Yamada, et al., vol. 35, No. 3, '99.

Proposal of Optical Near–Field Probe Using Evanescent Field of Microdisk Laser, Sakai, et al., Japan, '97.

* cited by examiner

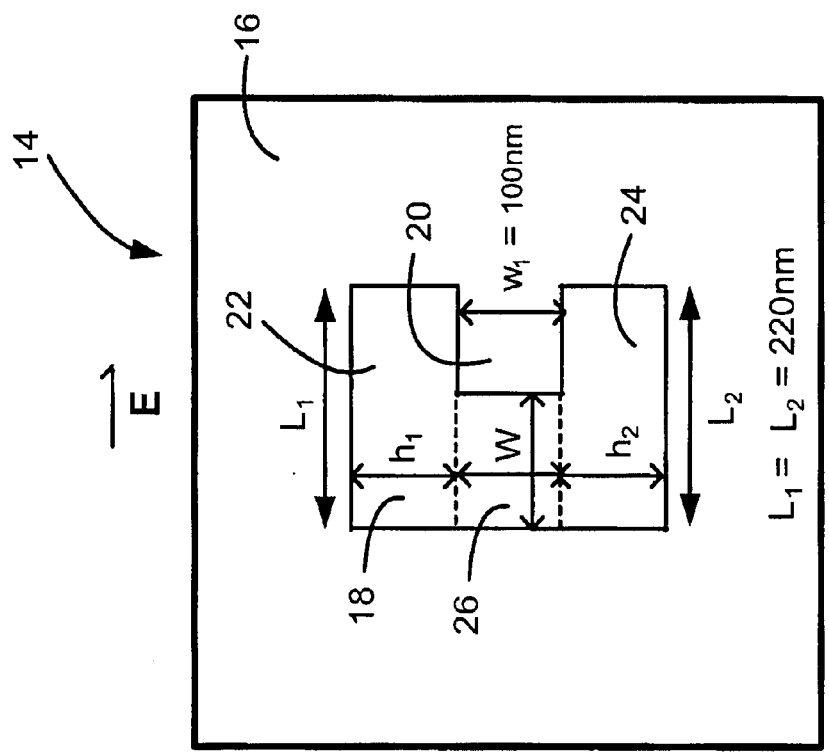
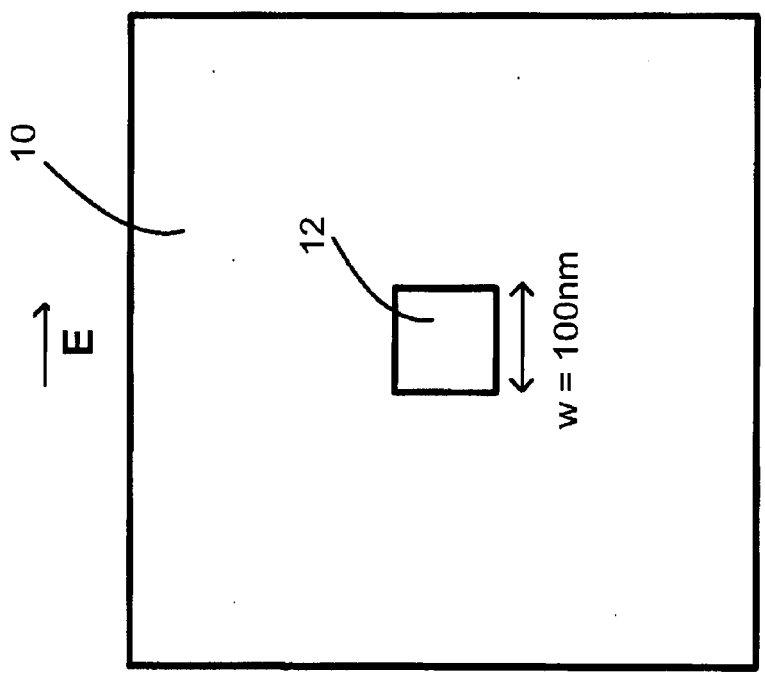
Fig. 2
Fig. 1

Square aperture

New aperture

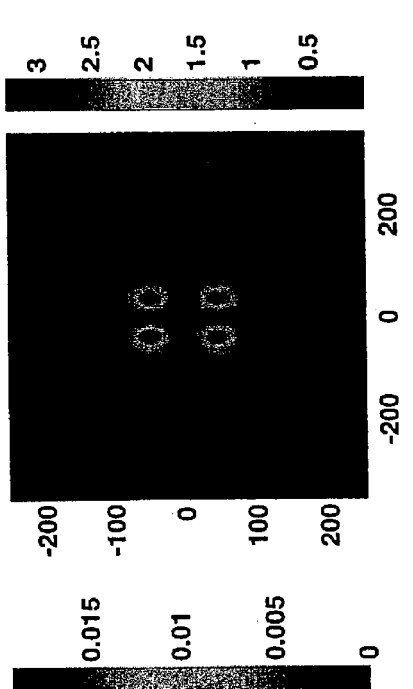
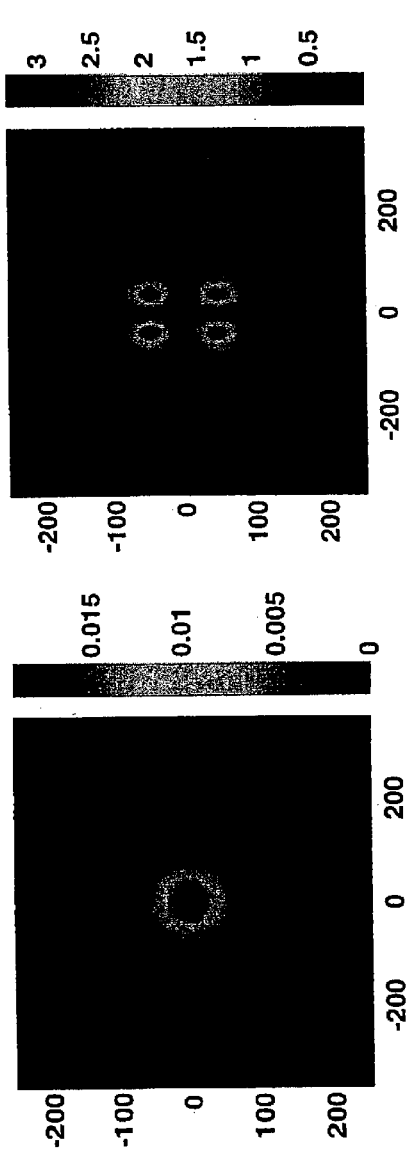
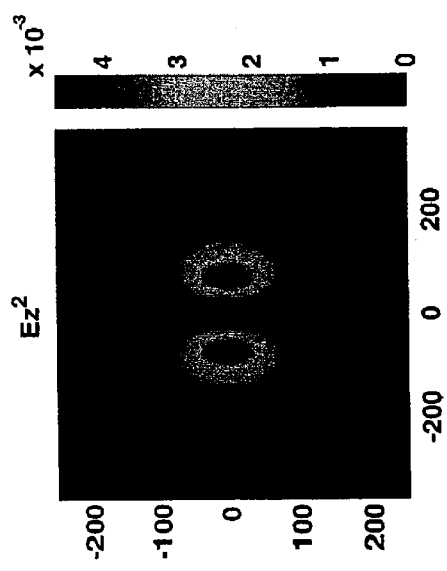

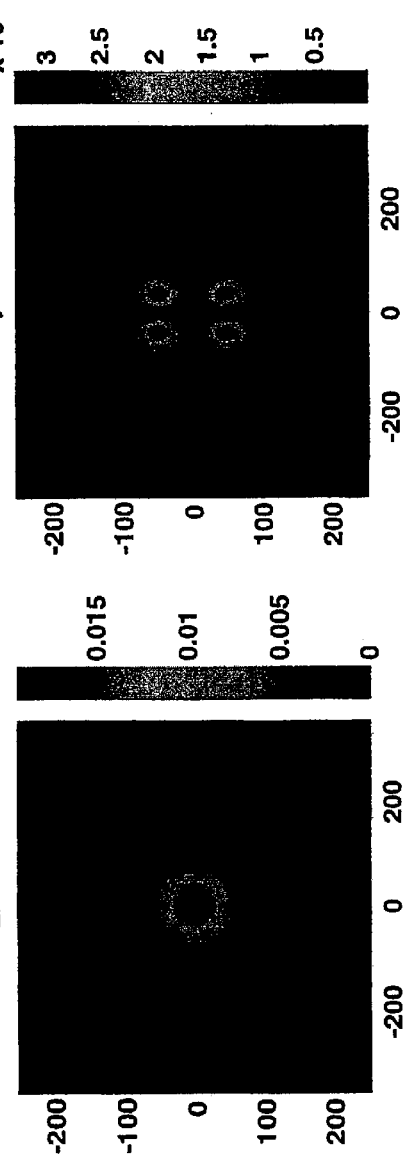
Fig. 10A $E_x^2$
Fig. 10B $E_y^2$
Fig. 10C $E_z^2$

FWHM = [ 80, 70 ] nm
         X   , Y

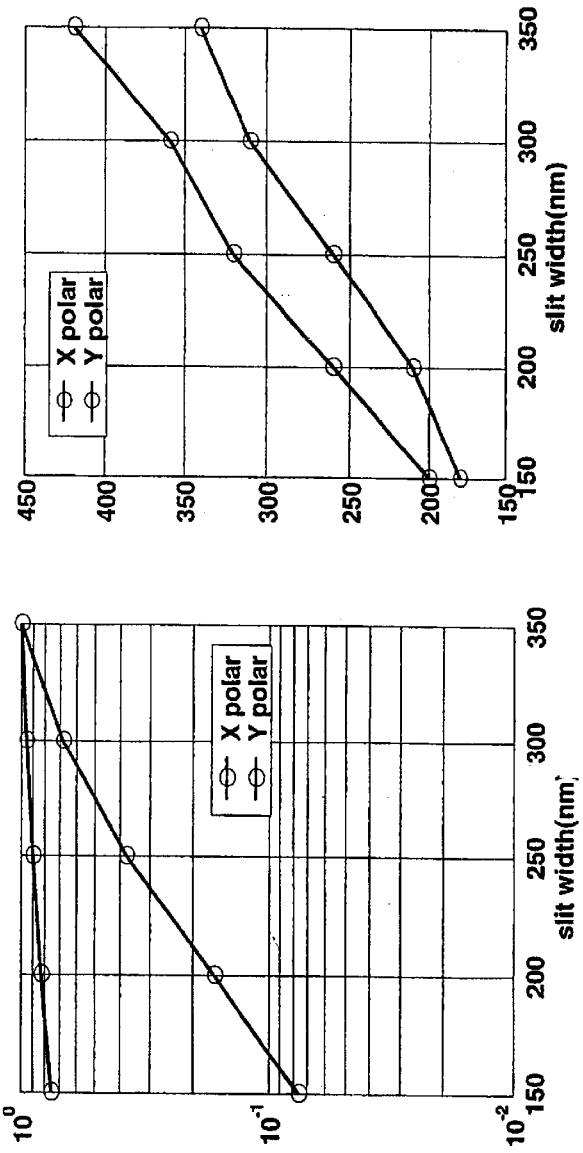
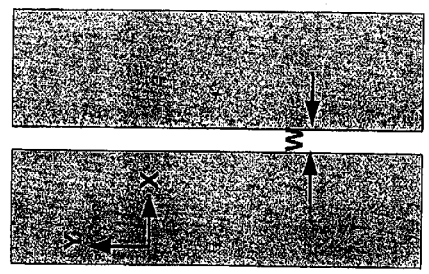
Fig. 14A
Fig. 14B
Fig. 14C
Fig. 14D

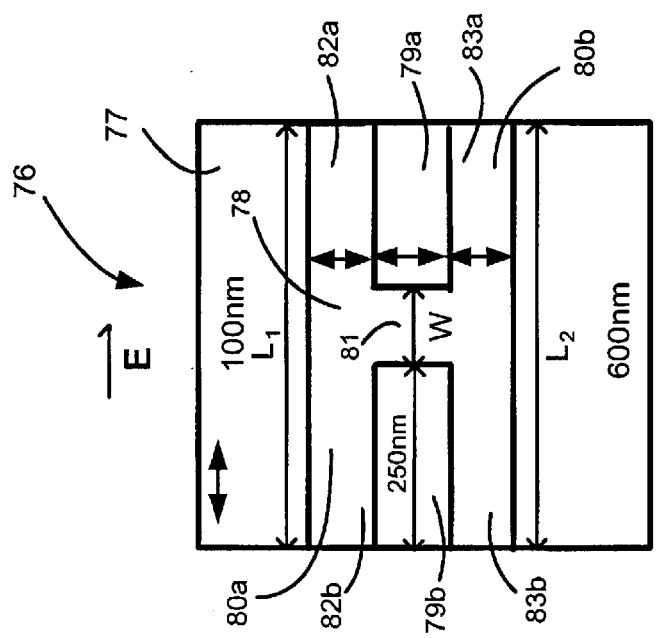
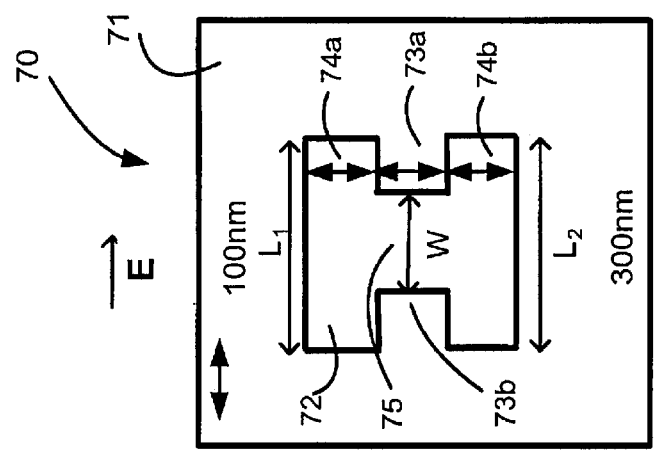
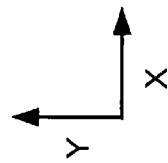
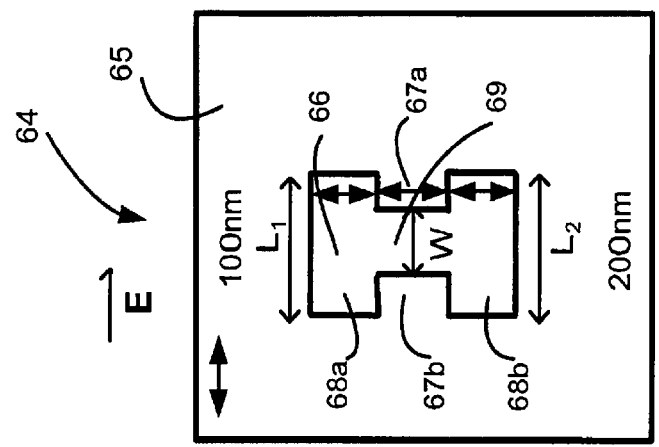
Fig. 23A  Fig. 23B  Fig. 23C $E^2$ at 48nm

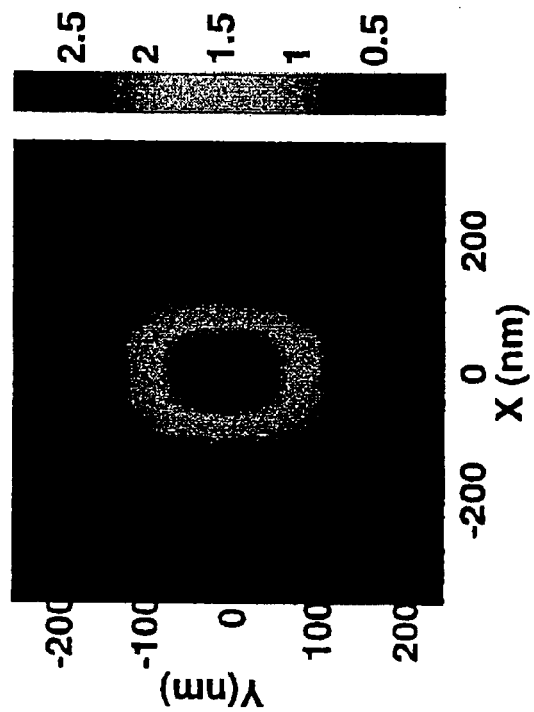
Fig. 25B
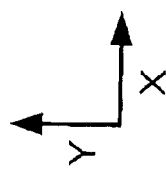
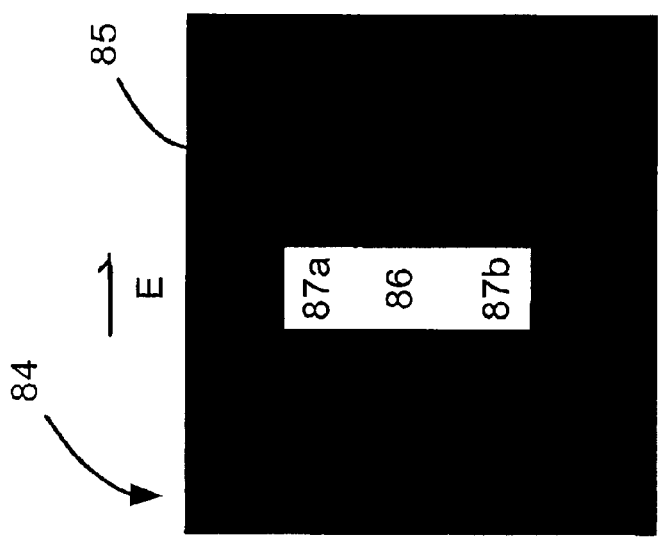
Fig. 25A

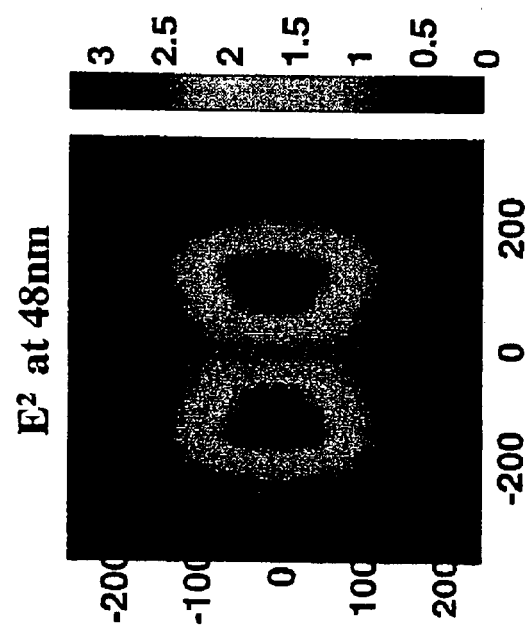
Fig. 26B
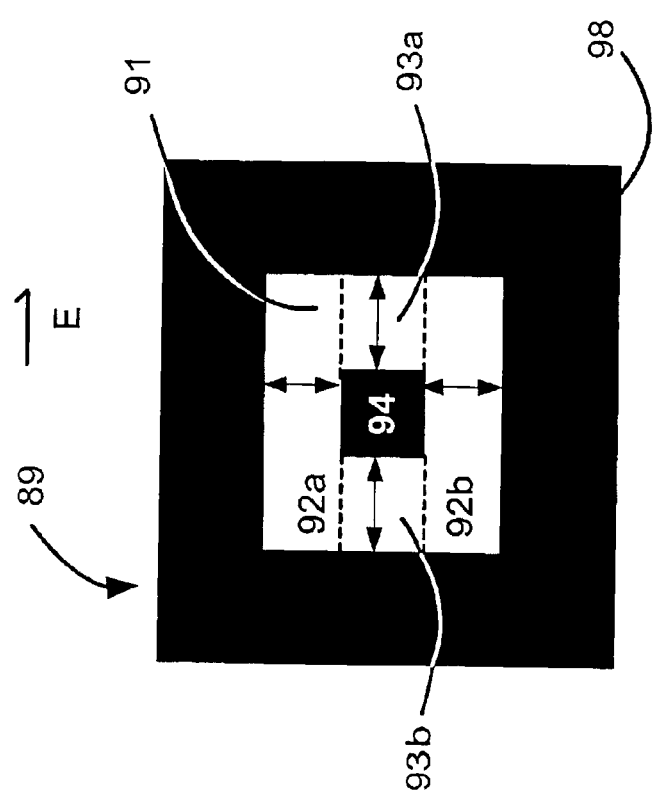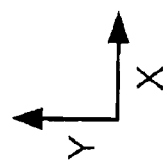
Fig. 26A

NEAR FIELD OPTICAL APPARATUS

RELATED APPLICATION DATA

This application is entitled to the benefit of U.S. Provisional Patent Application Ser. No. 60/151,492 filed on 08/30/99.

BACKGROUND OF THE INVENTION

1. Field of the Invention

This invention pertains generally to near-field optical devices and methods, and more particularly to an optical emitter apparatus and method utilizing a conductive plane with a resonant aperture configured for near field localization. The invention may be used with edge emitting, corner emitting and surface emitting semiconductor lasers as well as other near field radiation sources.

2. Description of the Background Art

Near-field optical techniques require the use of radiation source apertures and distances on the order of generally less than the wavelength $\lambda$ of the radiation source. Near field optical technologies offer high optical data storage densities, increased microscopic resolution, and other advantages. Near field technologies have utilized surface and edge emitting lasers, tapered optical fibers with metallized surfaces, and solid immersion lens techniques.

One class of semiconductor lasers which has appeared promising for near-field applications are vertical cavity, surface emitting lasers or VCSELs. These surface or top-emitting lasers generally have laser cavity or "post" with an active region surrounded by stacks of interleaved quarter wave semiconductor layers which define mirrors about the active region laser cavity. The active region can be in is in bulk form or have single or multiple quantum well, quantum wire and/or quantum dot structures therein. There are also p- and n-type conductive regions included on opposite sides of the active region, and the VCSEL can be turned on and off by varying the current through the p-n junction diode.

Top surface emitting GaAs, AlGaAs, AlGaInP, InGaAs, InGaAsP and InP VCSEL devices are relatively easy and inexpensive to manufacture, and generally can be produced via low-cost, high volume semiconductor IC fabrication methods using metal organic vapor phase epitaxy (MOVPE), liquid phase epitaxy (LPE) or molecular beam epitaxy (MBE) techniques. The laser cavity structures are typically deposited or grown vertically on a substrate and have an emission face defined by ion implantation, lateral oxidation, by polyimide or other dielectric, or free-standing post. The lateral oxidation and dielectric encapsulant techniques will generally provide for a lower effective refractive index in the region bounding the core of the laser structure, resulting in improved optical confinement relative to the ion implanted emission face. However, VCSEL devices of both types generally have been demonstrated with good reproducibility, uniformity and reliability.

Currently available VCSEL devices can be designed to effectively provide transverse and longitudinal mode laser light with a relatively high degree of intrinsic polarization. VCSELs also provide a radially symmetric Gaussian near-field with low divergence angle, which simplifies coupling to optics or fibers. An important drawback of VCSEL devices, however, is that they provide relatively low single mode optical power output compared to edge emitting lasers. The limitation on power output has limited the use of VCSEL devices in near-field technologies. Edge-emitting diode laser devices are known which provide higher optical power, but such devices are much more difficult and expensive to manufacture, and further require relatively large drive currents for operation.

For the purposes of near field optical recording, the total power requirement is modest and within the capability of the VCSEL device.

However, the power density at the emission facet is greatly reduced relative to the edge emitter. Since in near field applications it is the power density which is operative, the conventional edge emitter is advantaged over the conventional VCSEL.

There is accordingly a need for a near field optical device which provides high optical power density, which provides good near field localization, and which can be embodied in vertical cavity surface emitting lasers, edge emitting lasers and other radiation sources. The present invention satisfies these needs, as well as others, and generally overcomes the deficiencies found in the background art.

SUMMARY OF THE INVENTION

The present invention pertains to a near field optical apparatus which provides high output power with effective near field localization. In its most general terms, the invention is a near field optical apparatus comprising a conductive sheet or plane having an aperture therein, with the conductive plane including at least one protrusion which extends into the aperture. The location, structure and configuration of the protrusion or protrusions can be controlled to provide desired near field localization of optical power output associated with the aperture. Preferably, the location, structure and configuration of the protrusion are tailored to maximize near field localization at generally the center of the aperture. The aperture preferably has a perimeter dimension which is substantially resonant with the output wavelength of the light source, or is otherwise able to support a standing wave of significant amplitude.

By way of example, and not of limitation, the near field apparatus will also preferably include a light source. The conductive layer or plane may comprise a layer or sheet of gold, silver, platinum or other highly conductive metal or metal alloy associated with the light source. The protrusion of the conductive plane generally defines first and second regions in the aperture which are separated, or at least partially separated, by the protrusion. The protrusion also defies generally a waist or connecting section which joins or connects the first and second regions.

The first and second regions may be elongated in the direction of polarization of the light source. The protrusion may be in the form of a stub or tab which is rectangular, rounded, or pointed in shape or formed as a truncated point. The first and second regions may comprise first and second slots or slits which are substantially parallel to each other, with the slots separated by the protrusion of the conductive plane, and joined together by the connector region. The protrusion may be insular in nature, such that it is electrically isolated from the surrounding conductive plane.

In some presently preferred embodiments, the light source comprises a semiconductor laser, with the conductive plane comprising a metal layer associated with the emission facet of the laser, such that the invention provides a semiconductor laser apparatus with enhanced near field brightness. The invention may be embodied in a vertical cavity surface emitting laser comprising a laser apparatus having a laser active region, a first or upper reflective region adjacent one side of the active region, a second or lower reflective region adjacent the opposite side of the active region, a conductive and reflective metal layer adjacent the outer surface of the first reflective region, and an aperture in the metal layer which extends inward or downward through a portion of the reflective region, and which has dimensions which are generally smaller than the guide mode of the laser apparatus. The aperture is configured such that at least one protrusion in the metal layer extends into the aperture.

By way of example, and not of limitation, the active region of the laser apparatus preferably comprises a plurality of quantum well and quantum barrier structures. In one preferred embodiment of the invention, the upper reflective region preferably comprises a first or upper set of distributed Bragg reflector or DBR mirrors, and the lower reflective region preferably comprises a second or lower set of DBR mirrors. The upper DBR mirror set preferably comprises a plurality of p-doped, quarter wave dielectric layer pairs, and the lower DBR mirror set preferably comprises a plurality of n-doped quarter wave layer pairs. A p-doped semiconductor layer is preferably included between the quantum well active region and the upper, p-doped DBR mirror set, and an n-doped semiconductor layer is preferably included between the quantum well active region and the n-doped DBR mirror set. The conductive layer is preferred highly reflective, and may act as a mirror together with the upper DBR mirror set.

Preferably, a semiconductor contact layer is positioned between the reflective conducting layer and the upper DBR mirror set. Means are provided for optimizing adhesion of the reflective metal layer to the semiconductor contact layer, and means are provided for reducing reactivity between the reflective conducting layer and semiconductor contact layer. The adhesion optimization means and reactivity reducing means preferably comprise an oxide layer, preferably $TiO_2$, and an AlGaAs layer, positioned between the reflective conducting layer and the semiconductor contact layer.

The aperture in the emission face preferably extends inward from the emission face into the upper reflective layer such that a region of lower reflectivity is defined beneath the aperture. In one embodiment, a smaller number of dielectric layer pairs are present between the bottom of the aperture and the active region than are present between the surrounding emission face and the active region. The aperture in the emission face may extend inward, for example, to a depth such that there are between about one half and one quarter fewer quarter wave dielectric layer pairs between the bottom of the aperture and the active region than are between the emission face and the active region. In the embodiment with a metal reflective layer, the aperture preferably extends inward through reflective metal layer, such that the emission face surrounding the aperture has reflectivity from the reflective metal layer as well as a plurality of dielectric layer pairs, while the area beneath the aperture has reflectivity only from the plurality of dielectric layer pairs.

The aperture is dimensioned smaller than the guided mode of the laser apparatus, such that the aperture defines a region with a different reflectivity than the surrounding portions of the emission face, and so that the emission face overall presents two regions with different reflectivities. The region surrounding the aperture provides a higher reflectivity, due to greater thickness of the upper DBR mirror set and/or the presence of reflective metal layer, and presents a region having generally reduced laser loss and reduced threshold current, but with relatively reduced efficiency. The region of the upper DBR mirror set under the aperture has relatively greater mirror losses and higher laser threshold current due to the smaller number of dielectric layer pairs and/or the absence of a metallic reflective layer.

The inclusion of an aperture in the emission facet allows access to the high $E^2$-field region within the upper DBR mirror set, and increases the power density of the laser apparatus of the invention. The size and depth of the aperture can be varied to provide a selected or target loss. By reducing the number of dielectric layer pairs in the upper DBR mirror, then depositing a highly reflective metal layer on top of the DBR mirror to make up the reflectivity difference, and then etching an aperture through the reflective metal layer to access the high $E^2$-field region immediately inside the reflective metal layer, power densities similar to edge-emitting laser devices can be achieved over the dimension of the emitting aperture.

The aperture structure of the invention is based on several considerations. Polarization considerations are critical to optimizing the $E^2$-field strength at the center of the aperture, and the aperture is preferably configured to optimize or take advantage of polarization effects. In the case of an elongated slot, for example, as slot width decreases, the electric field components which are perpendicular to the edges of the slot can be supported more readily than electric field components which are parallel to the edges. Output power confinement and, to a lesser extent, geometry confinement of the aperture, are dependent on polarization.

Resonance effects associated with the perimeter of the aperture are also important considerations in the aperture configuration. When the physical size or dimensions of the aperture decrease to substantially less than the output wavelength, the aperture structure is decreasingly able to support a standing wave of significant amplitude around its perimeter.

The aperture configuration also must take areal effects into consideration. Generally, as the total aperture area decreases, the total emission throughput will increase. This consideration is most important for apertures of dimensions which are larger than the output wavelength.

The aperture can also be associated with an impedance value which should be considered. The aperture may define a radiative element in association with the laser as a transmission line which has an effective impedance, which should ideally be matched through the impedance of the aperture structure, to the impedance of the region into which the radiator is being coupled.

Yet another consideration in aperture design in accordance with the invention are local field effects. The geometry or structure of the aperture and emission facet should be adjusted to localize and maximize the total field intensity of $E_x^2+E_y^2+E_z^2$.

With the above considerations in mind, the use of one or more conductive protrusions which extend into the aperture, as noted above, has been found to allow optimization of near field localization and take advantage of polarization effects when used with a semiconductor laser or other light sources. A variety of such aperture configurations in accordance with the invention can be easily etched into a conductive sheet or layer using focussed ion beam (FIB) or other anisotropic etching techniques.

The conductive protrusion or protrusions define generally a plurality of regions in the aperture, which are separated by the protrusion or protrusions of the surrounding conductive sheet or plane which extend into the aperture. In the preferred embodiments wherein a single protrusion is used, the protrusion will define generally first and second regions which are separated by the protrusion. The protrusion also defines generally a waist or connecting section which joins the two regions separated by the protrusion. The regions thus defined are preferably configured such that they are elongated in the direction of the polarization of output light through the aperture. The elongated regions are preferably separated by the protrusion by a distance W wherein W<λ, such that the waists or connecting section and protrusion have generally a width W. The perimeter length or dimension of the aperture is preferably resonant with the wavelength λ of the output light.

The aperture of the invention may alternatively be considered as comprising first and second elongated regions connected by a waist or connecting section. Assuming that polarization is in a transverse direction, with respect to the aperture, the aperture may comprise a first transverse slot of length $L_1$, a second transverse slot of length $L_2$, and a connecting region or waist of width W which communicates with the first and second slots. Preferably, the first and second slots are of equal length, such that $L_1=L_2$, with each slot having a width equal to the width W of the connecting region.

In some preferred embodiments of the invention, the connecting section is centrally positioned with respect to the transverse slots, with two conductive protrusions defining the central connecting section. In other preferred embodiments, the connecting region is off-center with respect to the slots, as is provided by a single conductive protrusion. In some preferred embodiments the lengths of the slots are greater or substantially greater than the width W of the slots and connecting region ($L_1=L_2>W$). In other preferred embodiments, the length of the slots is generally equal to the width of the slots and connecting region ($L_1=L_2=W$). The slots may, alternatively, be of different lengths and widths.

In embodiments of the invention which utilize relatively long transverse slots ($L_1$ and $L_2>W$), the connector region between the slots will define a gap between conductive protrusions of surrounding conductive plate which are located between the transverse slots. The gap between the conductive protrusions will operate as a dipole radiator. In such embodiments, the antenna or transmission line characteristics of the laser emission facet and aperture are important, as are the dimensions of the transverse slots, connecting region and conductive protrusions. The aperture can define a short circuited transmission line configuration when a single connector region is located generally proximate the center of the transverse slots. Alternatively, additional connecting regions may be associated with the ends of the transverse slots such that a non-short circuited transmission line configuration is achieved.

In embodiments wherein the conductive protrusion is insular or electrically isolated from the surrounding conductive plane, the aperture in effect partitions the conductive plane into two regions which are electrically isolated from each other. This configuration provides means for creating an electric dipole in the emission plane of the aperture, and creates enhanced localized emission efficiency through the small separating region. The shape of the electrically isolated regions and separating region may be tailored to provide for enhancement of the emission as a result of electromagnetic resonance effects within the electrically isolated regions.

In still another preferred embodiment of the invention, an insular conducting protrusion will result in the aperture comprising two transverse slots each of length L and two connecting sections associated with the ends of the slots which define an annular-shaped aperture is formed. In the emission face of a laser, thus configuration provides a central core or "post" which is electrically isolated from the surrounding region of the emission face to create an electric dipole in the emission plane of the aperture. The created electric dipole provides an efficient radiator of optical energy at a given wavelength such that emission efficiency is enhanced. The annular aperture is analogous in shape to a coaxial waveguide structure. In yet another preferred embodiment, the aperture comprises two transverse slots of equal length L connected by three connector regions to define three electrically isolated regions on the emission face of the laser.

A goal of the invention is to provide a near field optical apparatus having an aperture structure which provides for efficient localization of electric field strength at optical frequencies to a region or regions which are smaller in dimension than the output wavelength associated with the aperture.

A goal of the invention is to provide a near field optical apparatus having an aperture with perimeter dimensions which are resonant with output wavelength.

A goal of the invention is to provide a near field optical apparatus having an aperture wherein a majority of aperture edges are substantially aligned with or parallel to the direction of polarization of the output light.

Another goal of the invention is to provide a near field optical apparatus which can be utilized with surface and edge emitting semiconductor lasers, tapered metallized fibers, SIL optics, and other near field optical systems.

Another goal of the invention is to provide a VCSEL apparatus which is easy and inexpensive to manufacture.

Further advantages of the invention will be brought out in the following portions of the specification, wherein the detailed description is for the purpose of fully disclosing the preferred embodiment of the invention without placing limitations thereon.

BRIEF DESCRIPTION OF THE DRAWINGS

The present invention will be more fully understood by reference to the following drawings, which are for illustrative purposes only.

FIG. 1 is a schematic illustration of a square aperture.

FIG. 2 is a schematic illustration of an aperture in accordance with the invention wherein a protrusion in the surrounding conductive plane extends into the aperture.

FIG. 9A through FIG. 9C are field plots of the x, y and z components of the $E^2$ field for the aperture of FIG. 1.

FIG. 10A through FIG. 10C are field plots of the x, y and z components of the $E^2$ field for the aperture of FIG. 2.

FIG. 14A is a schematic illustration of an elongated one dimensional slit of width W.

FIG. 14B is a graphical representation of normalized power flux versus slit width W for the slit of FIG. 14A, for light polarized in x and y directions.

FIG. 14C is a table illustrating normalized power flux and beam width through the slit of FIG. 14A, for x and y polarization at varying slit widths.

FIG. 14D is a graphical representation of Full Width Half Maximum dimension (nm) versus slit width for x and y polarization at varying slit widths.

FIG. 23A through FIG. 23C are schematic illustrations of alternative embodiment apertures in accordance with the invention wherein two conductive protrusions extend into the aperture.

FIG. 25A is schematic illustration of an elongated slot aperture in accordance with the invention, and FIG. 25B is a field plot of normalized $E^2$ field for the aperture of FIG. 25A.

FIG. 26A is schematic illustration of an aperture in accordance with the present invention having a conductive protrusion which is electrically isolated from the surrounding conductive plane, and FIG. 26B is a field plot of normalized $E^2$ field for the aperture of FIG. 26A.

DETAILED DESCRIPTION OF THE PREFERRED EMBODIMENTS

Referring more specifically to the drawings, for illustrative purposes the present invention is embodied in the apparatus and graphical representations shown generally in FIG. 2 through FIG. 26 and FIG. 28 through FIG. 36. It will be appreciated that the apparatus may vary as to configuration and as to details of the parts without departing from the basic concepts as disclosed herein. The invention is disclosed primarily in terms of use with a vertical cavity surface emitting laser (VCSEL) made of AlGaAs materials. However, it will be readily apparent to those skilled in the art that the invention may be embodied in edge emitting or other types of semiconductor lasers, as well as with various other light sources for near field applications Various other uses for the invention will suggest themselves to those skilled in the art upon review of this disclosure.

The invention will be more fully understood by referring first to FIG. 1, where there is shown an infinite conductive plane or sheet 10 having a simple square aperture 12 therein. Conductive sheet 10 is positioned in association with a light source (not shown) such that radiation from the light source passes through the aperture. The scaling laws for a small square aperture 12 are well known and are described in "Theory of Diffraction by Small Holes" by H. H. Bethe, Physical Review, Vol. 66, pp. 163–182 (1944). For an aperture 12 which is much smaller in dimension than the wavelength $\lambda$ of incident radiation, the radiation coupled through the aperture is proportional to the sixth power ($r^6$) of the radius r of aperture 12. For apertures which are substantially larger than the wavelength $\lambda$ of incident radiation, the radiation coupled through aperture 12 has only a second power dependence ($r^2$) on the relative area of aperture 12. The sixth power dependence has a component of scaling which is due to the overall length or dimensions of the perimeter of aperture 12.

Using conventional Finite Difference Time Domain (FDTD) calculation techniques, and assuming that conductive sheet 10 is an infinite plane of perfect electrical conductor, the relative output power and $E^2$ field strength can be accurately determined for the aperture 12, as well as numerous other aperture configurations which are described further below.

Figure 3:
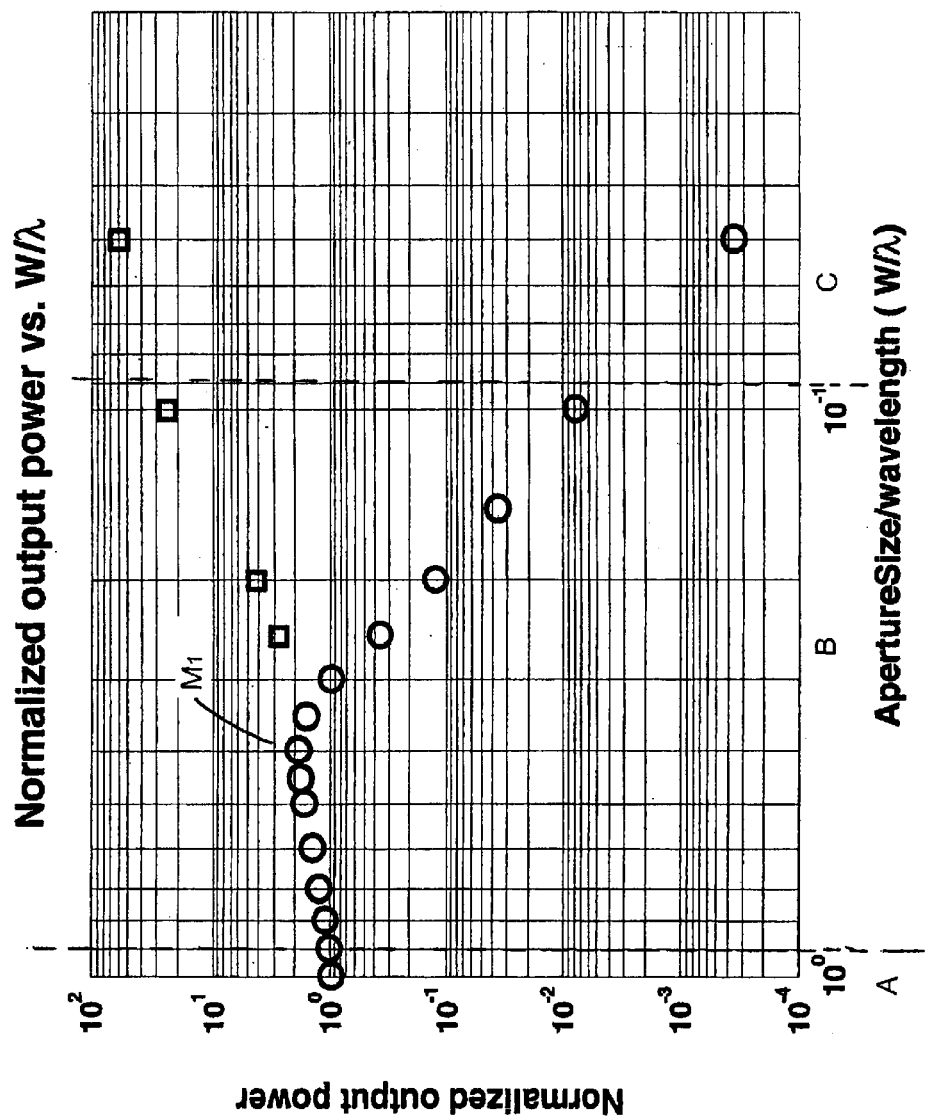
FIG. 3 is a graphical representation of relative far field power versus aperture size for the apertures of FIG. 1 and FIG. 2.

FIG. 3 graphically illustrates normalized output power associated with aperture 12 versus size of aperture 12 (shown as circles) as aperture width W over incident wavelength $\lambda$ (W/$\lambda$), for light of wavelength $\lambda$=1000 nanometers (nm), and width W=100 nm, as determined by FDTD. For clarity, aperture size in FIG. 3 is shown as three separate regions. In region A, the aperture size is large relative to the wavelength (W>>$\lambda$). Region B is a transition region wherein aperture width is approximately the same as the wavelength (W$\approx\lambda$). In region C, the aperture size is small relative to the wavelength (W<<$\lambda$). While the aperture 12 is relatively large with respect to the incident wavelength as in region A, normalized output power through the aperture 12 remains relatively constant. As the width or diameter W of aperture 12 decreases to W$\approx\lambda$ in the transition region B, the normalized output power increases to a maximum $M_1$ in output power, after which the output power begins to decrease. In the small aperture region C, normalized output power drops off sharply and rapidly becomes vanishingly small. The maximum $M_1$ in output power is largely due to a resonance effect wherein the perimeter of the aperture 12 has a dimension which is substantially resonant with the wavelength $\lambda$ and can support a standing wave at $\lambda$ of significant or substantial magnitude.

Figure 4:
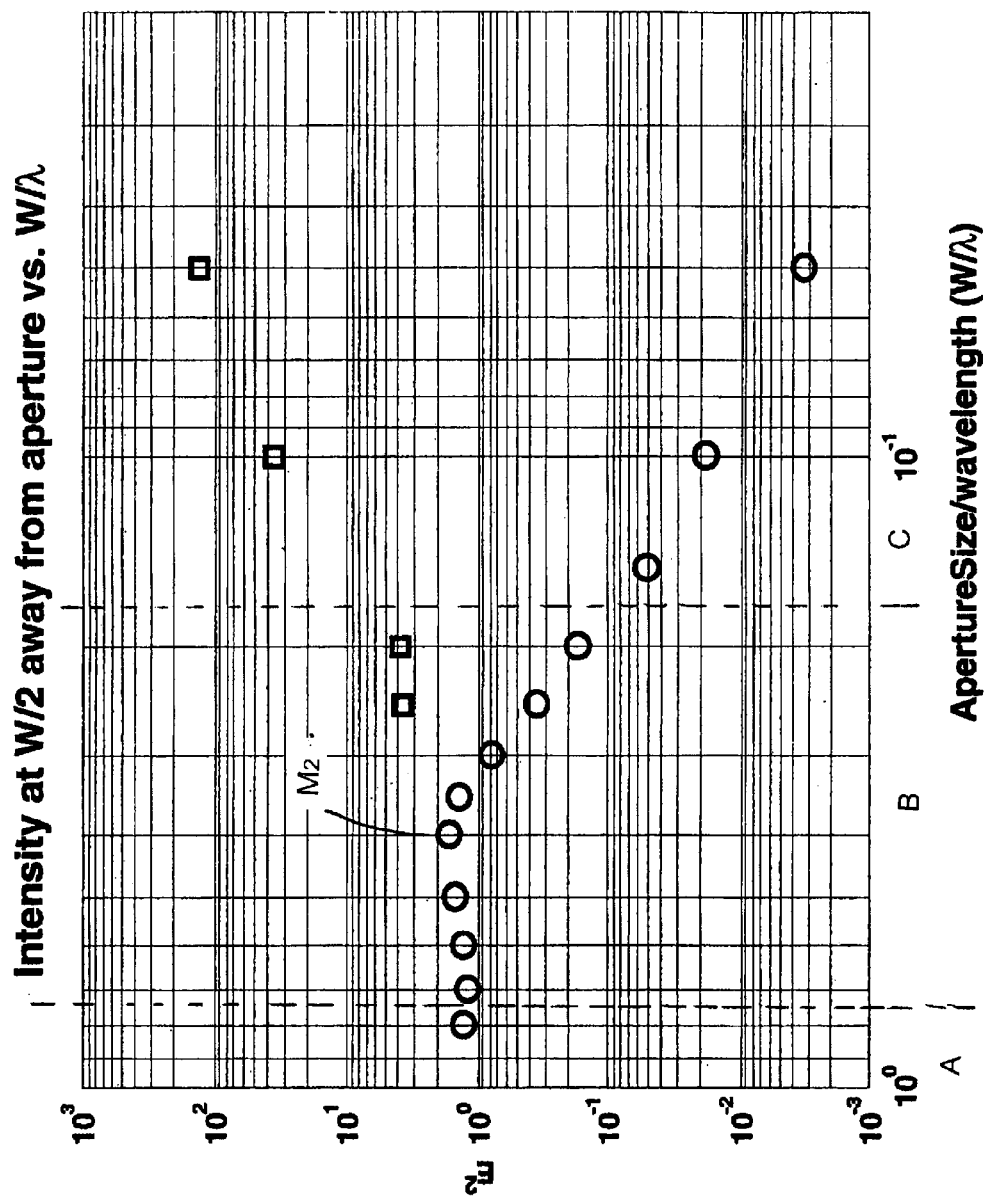
FIG. 4 is a graphical representation of relative near field normalized $E^2$ versus aperture size for the apertures of FIG. 1 and FIG. 2.

In FIG. 4, normalized near field $E^2$ is shown as circles for aperture 12, as a function of aperture size (W/$\lambda$) at a near field distance of W/2 away from aperture 12, for W=100 nm and $\lambda$=1000 nm, as determined via FDTD calculations. FIG. 4 again shows aperture size in terms of a large aperture region A, a transition region B, and a small aperture region C. In the large aperture region (W>>$\lambda$), field intensity remains relatively constant. As the width W of aperture 12 decreases to W=$\lambda$ in the transition region B, the normalized field strength increases to a maximum $M_2$ associated with resonance before starting to diminish, and in the small aperture region (W<<$\lambda$) the normalized field strength drops off sharply.

The presence of the maxima $M_1$, $M_2$ as noted above indicate that, in the transition region B, the decrease in output power and near field $E^2$ with decreasing aperture size are significantly effected by the aperture perimeter or periphery dimensions, rather than merely the area of the aperture. Thus, if the overall effective size or area of the aperture could be decreased while maintaining perimeter at a length or dimension which is substantially resonant with the output wavelength, the drop off in output power and near field $E^2$ as shown in regions C of FIG. 3 and FIG. 4 can be avoided.

The present invention advantageously provides a near field apparatus having an aperture which can be reduced or scaled downward in size while maintaining high near field $E^2$ strength and output power.

With the above in mind, reference is now made to FIG. 2, wherein a near field optical apparatus 14 in accordance with the invention is shown. The apparatus 14 includes a conductive sheet, layer or plane 16 having a hole or aperture 18 therein, with at least one protrusion or tab 20 of conductive sheet which extends into aperture 18. The overall size or area of aperture 18 can be decreased while maintaining the perimeter length or dimensions of aperture 18 at resonance, by varying the location, size, and configuration of protrusion 20. The conductive plane 16 may be made of metal, metal alloy, semiconductor or other conductor or semiconductor material.

Protrusion 20 defines generally a first region 22 and a second region 24 in aperture 18 which are separated, or at least partially separated, from each other by protrusion 20. Protrusion 20 also defines a waist or connecting section 26 which joins or connects first and second regions 22, 24. Connecting section 26 constitutes an effective localization aperture which is substantially centrally located with respect to aperture 18 overall. In the aperture 18 of FIG. 2, the width W of the localization aperture 26 can be decreased while maintaining the overall perimeter length of aperture 18 at the resonance point, by increasing the length and/or width of protrusion 20 as the aperture width is decreased. The presence of protrusion 20 in effect creates a folded slot configuration for aperture 18, so that the overall size of the localization aperture 26 is scalable while allowing the perimeter dimension to be maintained or held at a resonance dimension with respect to output wavelength, by varying the shape of the folded slot.

Referring again to FIG. 3, the relative output power associated with aperture 18 versus size (width) of the connector region or localization aperture 18 is shown as squares, taking into account variation of the dimensions of protrusion 20 as the width of localization aperture 26 is decreased. As can be seen, the relative output power can be maintained at, and even increased from, the maximum level, by keeping the perimeter dimensions of aperture 18 resonant with the output wavelength. Referring again to FIG. 4 as well, the relative near field $E^2$ intensity with respect to aperture size for localization aperture 26 (shown as squares) can be maintained at, and even increased from, the maximum level provided by a simple square aperture.

Figures 5, 6, 7, 8:
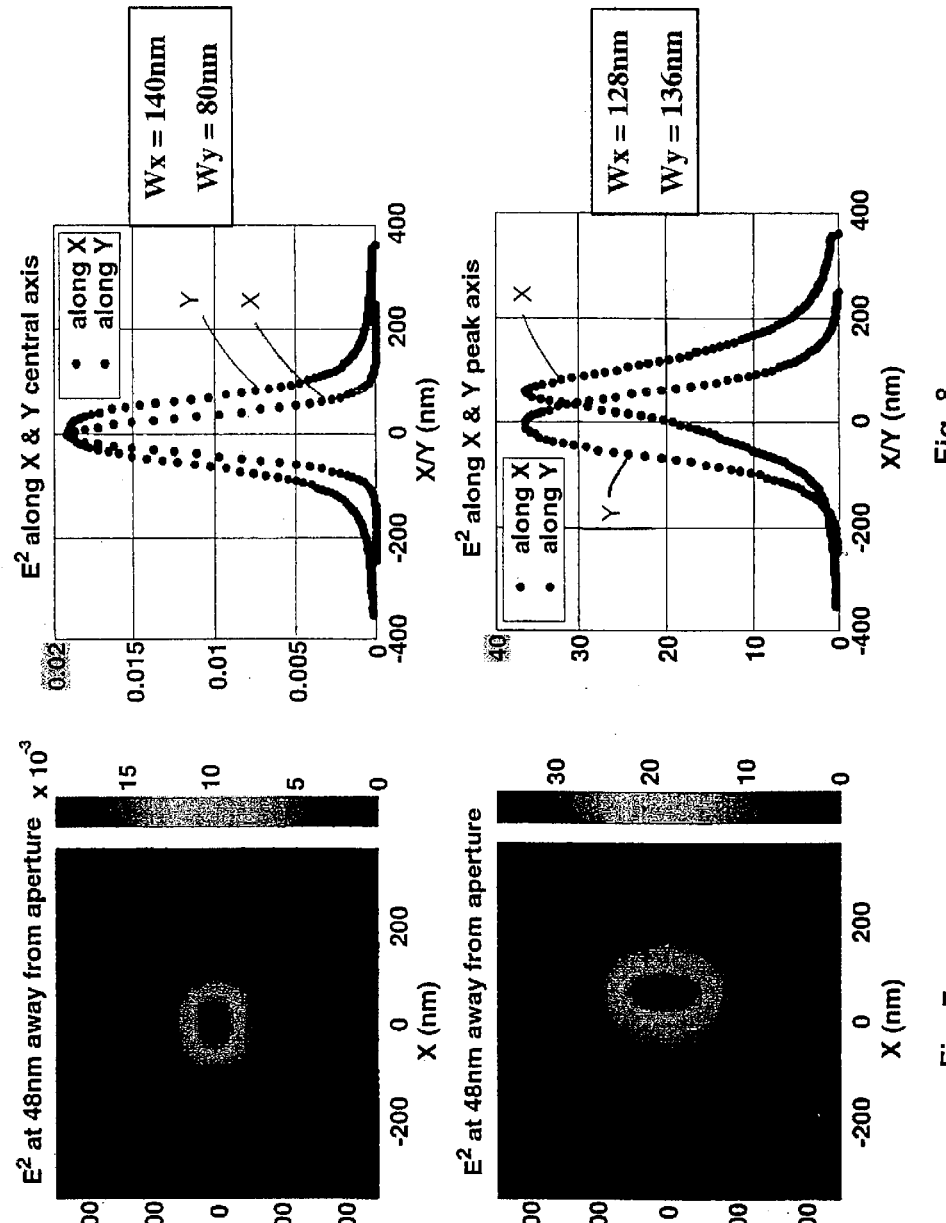
FIG. 5 is a field plot of normalized $E^2$ field for the aperture of FIG. 1
FIG. 6 is a graphical representation of the normalized $E^2$ field of FIG. 5 along the x and y axes.
FIG. 7 is a field plot of normalized $E^2$ field for the aperture of FIG. 2.
FIG. 8 is a graphical representation of the normalized $E^2$ field of FIG. 7 along the x and y axes.

FIG. 5 is a field plot of normalized $E^2$ for the square aperture 12 of FIG. 1 at a distance of approximately W/2 from aperture 12, as determined by FDTD calculation assuming a width W=100 nm for aperture 12 and $\lambda$=1000 nm. FIG. 6 a graphical illustration of $E^2$ along the x and y central axis for the aperture 12 of FIG. 1 as determined by FDTD calculation. From FIG. 6, it can be seen that the Full Width at Half Maximum (FWHM) in the x direction is approximately 140 nm, and is approximately 80 nm in the y direction. The normalized near field $E^2$ is centrally and symmetrically localized for square aperture 12. From FIG. 5, however, it can be seen that the localized $E^2$ field strength provided by aperture 12 is quite small. For a relative incident intensity=1, the peak $E^2$ field from aperture 12 is $2 \times 10^{-2}$.

Thus, a simple square aperture is, in general, a very inefficient way to confine radiation to a small sub-wavelength region for near field applications. This is largely due to the aperture boundary approaching an equipotential of the electric field as the aperture size approaches zero.

Despite this limitation, the simple square aperture 12, or the circular equivalent, provides a conceptually simple means for field localization, and heretofore, such simple apertures have been widely used in near field techniques even though the localized field provided by the aperture rapidly becomes vanishingly small.

Referring now to FIG. 7, a field plot of normalized $E^2$ for the aperture 18 of near field apparatus 14 of the invention is shown, as determined by FDTD calculation for a distance of approximately W/2 from aperture 12, with an incident wavelength $\lambda$=1000 nm, and with light polarized in the transverse or x direction. In the specific example of FIG. 7, the connector region or localization aperture 26 (FIG. 2) has a width and height of W=100 nm, while first region 22 has a length $L_1$=220 nm and a height $h_1$=100 nm, and second region 24, 22 has a length $L_2$=220 nm and a height $h_2$=100 nm. From these dimensions, the aperture 18 has an overall width of $L_1$=$L_2$=220 nm, and an overall height of W+$h_1$+$h_2$=300 nm. The localized $E^2$ field strength provided by aperture 18, as shown in FIG. 7, is approximately three orders of magnitude, or 1000×, greater than the corresponding localized $E^2$ field resulting from square aperture 12. For an incident intensity=1, the peak localized $E^2$ field strength for aperture 18 is approximately 37. Thus, the aperture 18 provides a tremendous improvement in near field output power over a simple square aperture 12.

The above specific dimensions for localization aperture 26 and first and second regions 22, 24 merely provide one specific example of the possible dimensions for aperture 18, and should not be considered limiting. Additionally, the localization region need not necessarily be square in shape as shown in FIG. 2, and may have a width different from its height. The particular values for $L_1$, $L_2$, W, $h_1$ and $h_2$ will necessarily vary to optimize aperture power output and near field localization under different wavelength conditions.

FIG. 8 is a corresponding graphical illustration of $E^2$ along the x and y central axis for the aperture 18 of FIG. 2 as determined by FDTD calculation. From FIG. 7 and FIG. 8, it can be seen the that the normalized $E^2$ is substantially centrally and symmetrically localized despite the somewhat asymmetric shape imparted to aperture 18 by the presence of protrusion 20. FIG. 8 shows a FWHM of approximately 128 nm in the x direction and approximately 136 in the y direction. Thus, the aperture 18 of the invention provides near field localization comparable to the symmetrical square aperture 12 even though the aperture 18 of the invention is larger overall (220 nm wide by 300 nm high) than square aperture 12,(100 nm width), and even though the aperture 18 is not symmetric about the center of aperture 18.

The effective near field localization provided by aperture 18 will be more fully understood by considering the x, y and z components of the normalized $E^2$ field. FIG. 9A through FIG. 9C are field plots of the x, y and z components of the normalized $E^2$ field of FIG. 5 for square aperture 12 as determined via FDTD calculation. FIG. 10A through FIG. 10C show the corresponding x, y and z components of the normalized $E^2$ field of FIG. 7 for the aperture 18 of the invention as determined by FDTD calculation. For optimum field localization, it is necessary to maintain the maxima of $E_x^2$, $E_y^2$ and $E_z^2$ components as close together as possible. The shape of aperture 18 tends to suppress one lobe of the relatively large z component, as shown in FIG. 10C, which partially accounts for the good field localization provided by aperture 18. The y component, while dual lobed, is relatively weak, and is also relatively central in location, and therefore does not substantially detract from the field localization provided by aperture 18.

Figure 11:
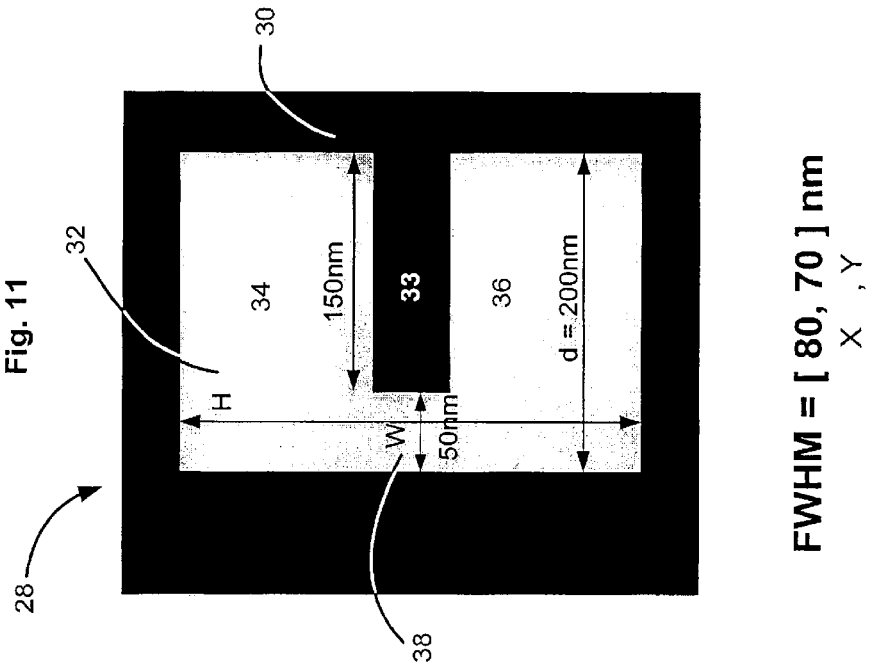
FIG. 11 is schematic illustration of an alternative embodiment aperture in accordance with the present invention.

The aperture of the invention advantageously is scalable to smaller sizes without resulting in decrease of near field power output, as occurs in the conventional square aperture 12. Referring to FIG. 11, an alternative embodiment near field optical apparatus 28 is shown. The apparatus 28 includes a sheet, plane or layer 30 of conductive metal or like conductive material, with an opening or aperture 32 therein. A stub or protrusion 33 of the conductive plane 30 extends into aperture 30, such that first and second regions 34, 36 are defined. Protrusion 32 also defines a waist or connecting section 38 which joins first and second regions 34, 36, and which serves effectively as a localization aperture.

Figure 12:
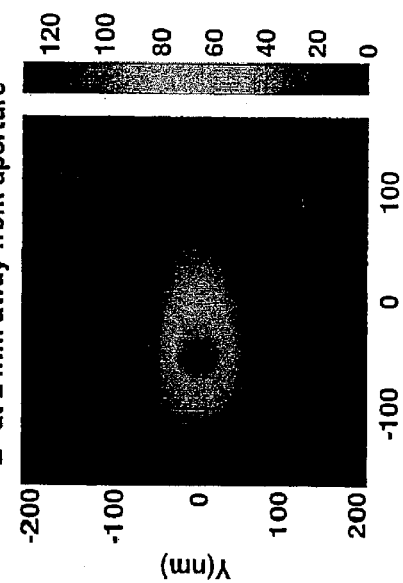
FIG. 12 is a field plot of normalized $E^2$ field for the aperture of FIG. 11.
Figure 13:
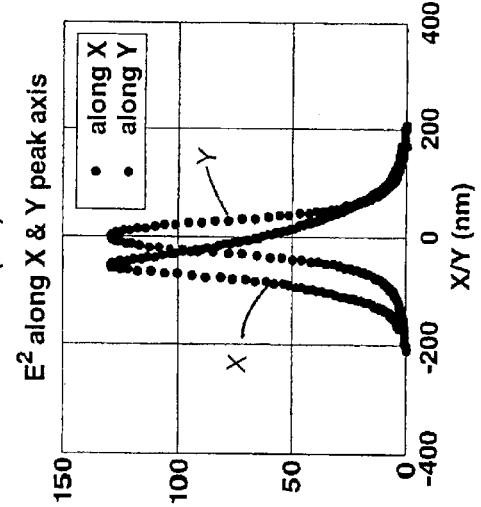
FIG. 13 is a graphical representation of the normalized $E^2$ field of FIG. 12 along the x and y axes.

FIG. 12 shows the normalized $E^2$ field strength for the near field apparatus 28 at a distance of approximately W/2 from aperture 32, as determined by FDTD calculation where w=50 nm (the width of localization aperture 38) and $\lambda$=1000 nm. The overall width d of aperture 32 is 200 nm for the example of FIG. 12, with the length of tab or protrusion 32 being 150 nm. FIG. 13 is graphical illustration of $E^2$ along the x and y central axis for the aperture 32 of FIG. 11 according to FDTD calculation, and shows the Full Width at Half Maximum (FWHM) in the x direction to be approximately 80 nm, and approximately 70 nm in the y direction.

From FIG. 12 and FIG. 13 it can be seen that the normalized $E^2$ field strength and degree of localization provided by the aperture 32, having an overall width of 200 nm, is even greater than that provided by the larger aperture 18 of 300 nm width. The localization of normalized $E^2$ field, however, is not as centrally located with respect to the center of aperture 32, as was the case for aperture 18 described above. The off center localization is due at least in part to the length of tongue or protrusion 32, which extends into and substantially across aperture 32, and which results in the individual x, y and z $E^2$ field components (not shown) being slightly off-center. Despite the slightly off-center localization, the overall field strength offered by aperture 32 and near field device 28 is highly useful in most near field applications.

In optimizing the structure and configuration of a near field aperture in accordance with the invention, there are several important considerations to be kept in mind. Polarization considerations are essential to optimizing the $E^2$-field strength at the center of the aperture, and the aperture of the invention is preferably configured to optimize or take advantage of polarization effects. In considering polarization effects, reference is made to FIG. 14A through 14D. FIG. 14A schematically illustrates an elongated one dimensional slit of width W. FIG. 14B graphically illustrates normalized power density, as Poynting vector Sz, derived from the slit of FIG. 14A, for light polarized in the x and y directions and varying width W of the slit of FIG. 14A. FIG. 14C is a table which provides normalized power flux and beam width for x and y polarized light through varying slit widths, and FIG. 14D illustrates full width half maximum dimension versus slit width for x and y polarized light.

For decreasing slit width, the electric field components which are perpendicular to the edges of the slit can be supported more readily than electric field components are parallel to the edges of the slit. This can be seen from FIG. 14B and FIG. 14C, which show that the normalized power flux Sz for x-polarized light (polarization perpendicular or transverse to the slit) remains relatively constant as slit width decreases, while power flux for the y-polarized light (polarization parallel to slit) falls off or decreases with decreasing slit width. Thus, the preferred aperture will be structured and configured to take advantage of polarization by having relatively large number of edges which are substantially perpendicular to the electric field direction. The near field apparatus 14 of FIG. 2 provides this feature. From FIG. 14D, it can be seen that the full width half maximum dimension for both x- and y-polarized light decreases with decreasing slit width, but with the x-polarized light (perpendicular to slit) being slightly greater than for y-polarized (parallel to slit) light. Thus, once again, configuration of the aperture to keep edges perpendicular to the direction of polarization is preferable. This is provided by regions 22, 24 of aperture 18 being at least partially elongated in the transverse or x direction, with polarization being generally parallel to the transverse or x direction.

Resonance effects associated with the perimeter length or dimension of the aperture are also important in providing good near field brightness from a small aperture. When the physical size or dimensions of the aperture decrease to substantially less than the output wavelength, the aperture structure is decreasingly able to support a standing wave of significant amplitude around its perimeter, as noted above with regard to FIG. 3 and FIG. 4. As also noted above, the present invention provides an aperture which is scalable to smaller size while maintaining perimeter length at resonance with output wavelength by providing a protrusion of conducting surface into the aperture, which can be varied in size and shape as the overall size of the aperture itself is decreased.

Figure 15:
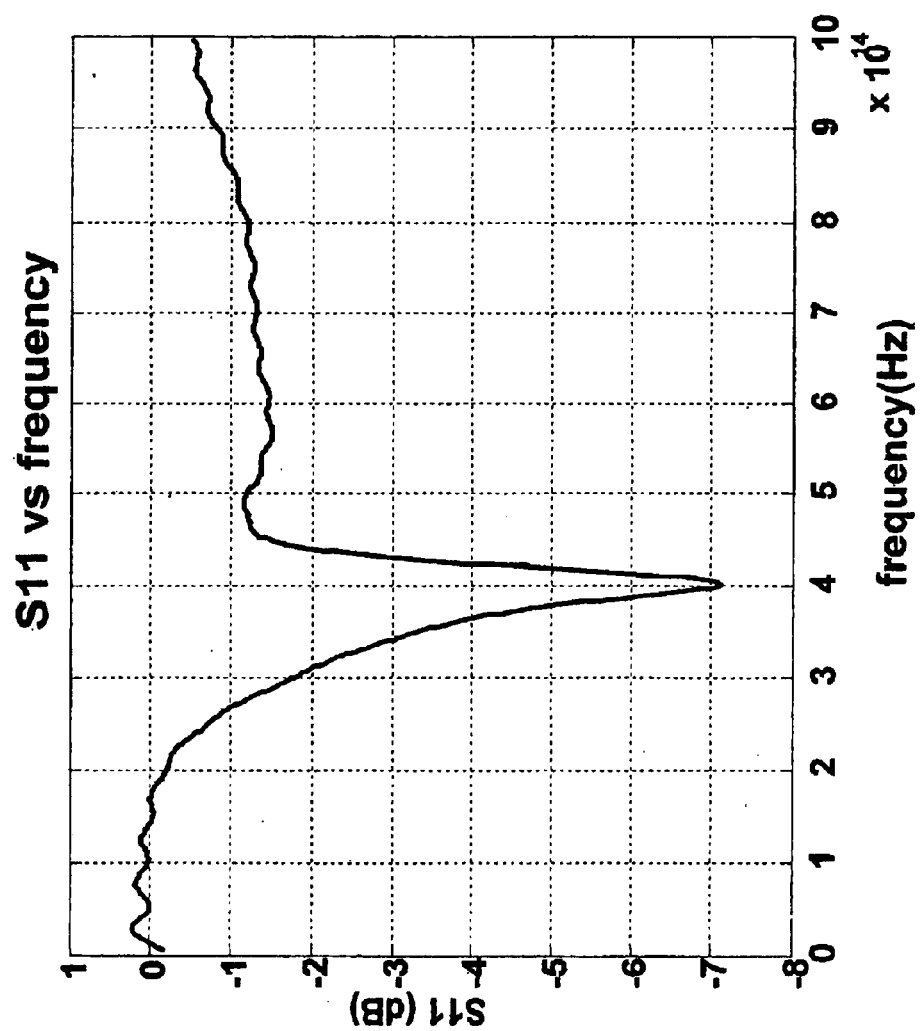
FIG. 15 is a graphical representation of the $S_{11}$ scattering parameter versus frequency for the aperture of FIG. 2.

The resonance effect associated with the aperture 18 of FIG. 2 can be observed in several aspects. FIG. 15 graphically shows the scattering parameter. $S_{11}$ (decibels) versus frequency (Hertz) for the aperture 18 of FIG. 2, for the aperture dimensions shown in FIG. 2 and λ=1000 nanometers when excited with an electrical pulse, according to FDTD calculation. As can be seen, the scattering parameter $S_{11}$ increases substantially near resonance at approximately $4 \times 10^{14}$ Hz.

Figure 16:
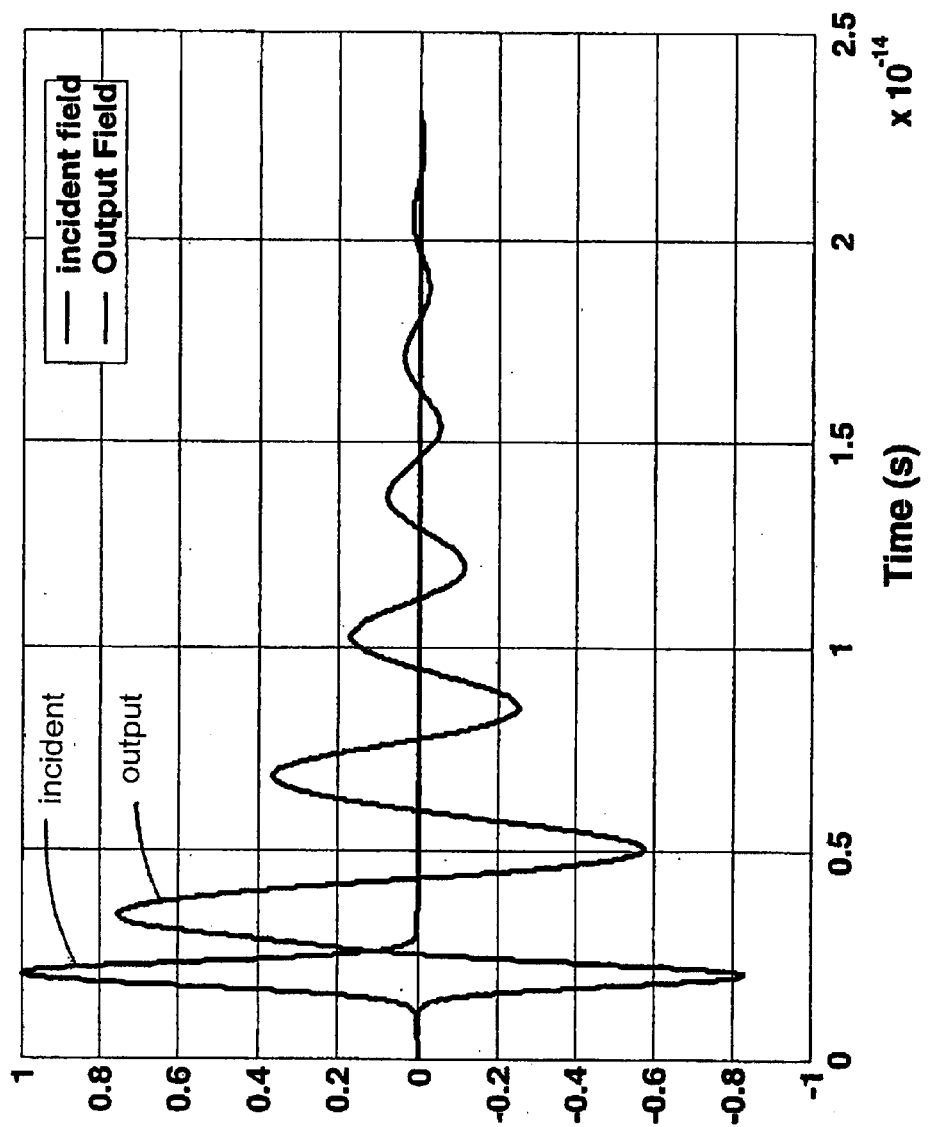
FIG. 16 is a graphical representation of relative field strength versus time for a pulsed plane wave incident on, and output from, the aperture of FIG. 2.
Figure 17:
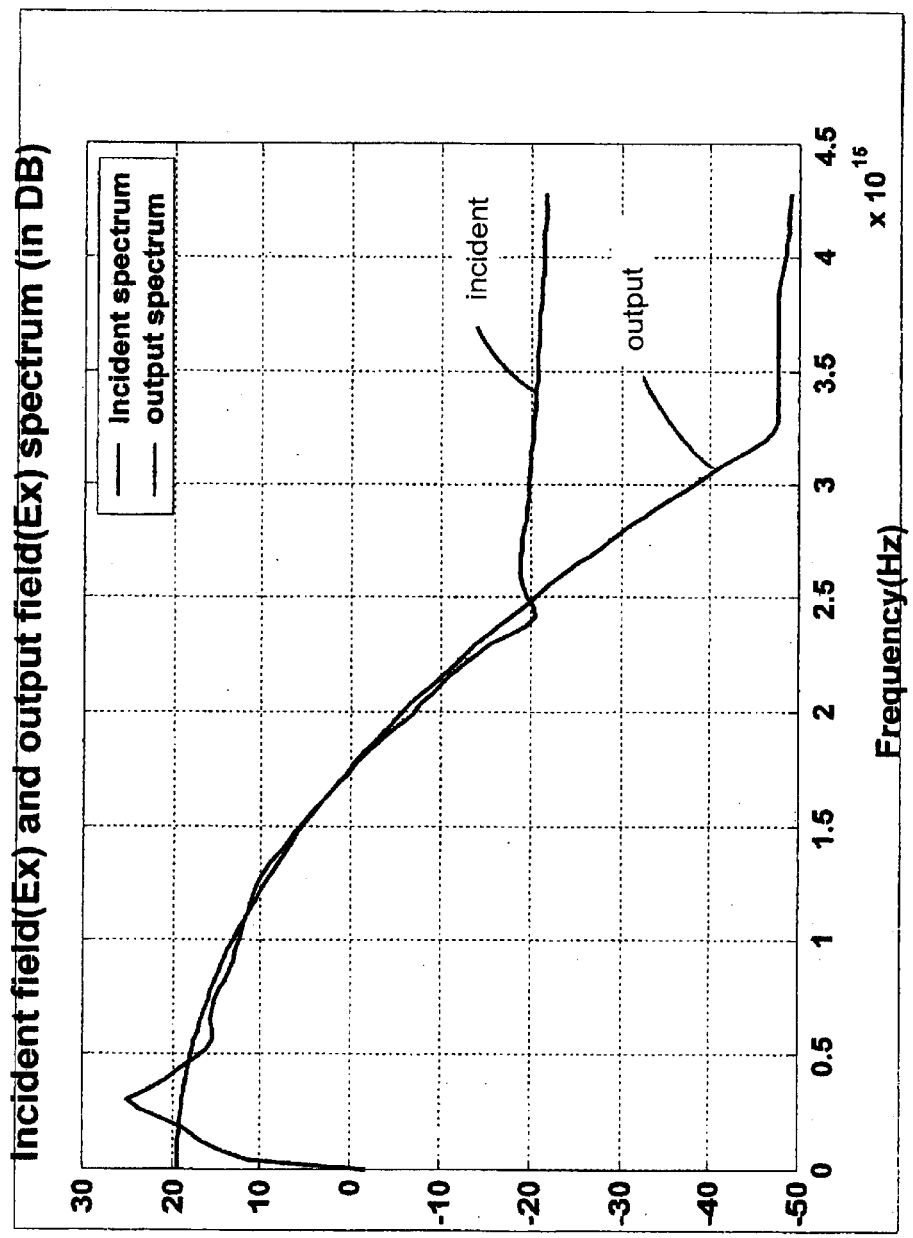
FIG. 17 is a graphical representation of the Fourier transforms of the incident and output fields of FIG. 16, shown as relative field strength versus frequency.
Figure 18:
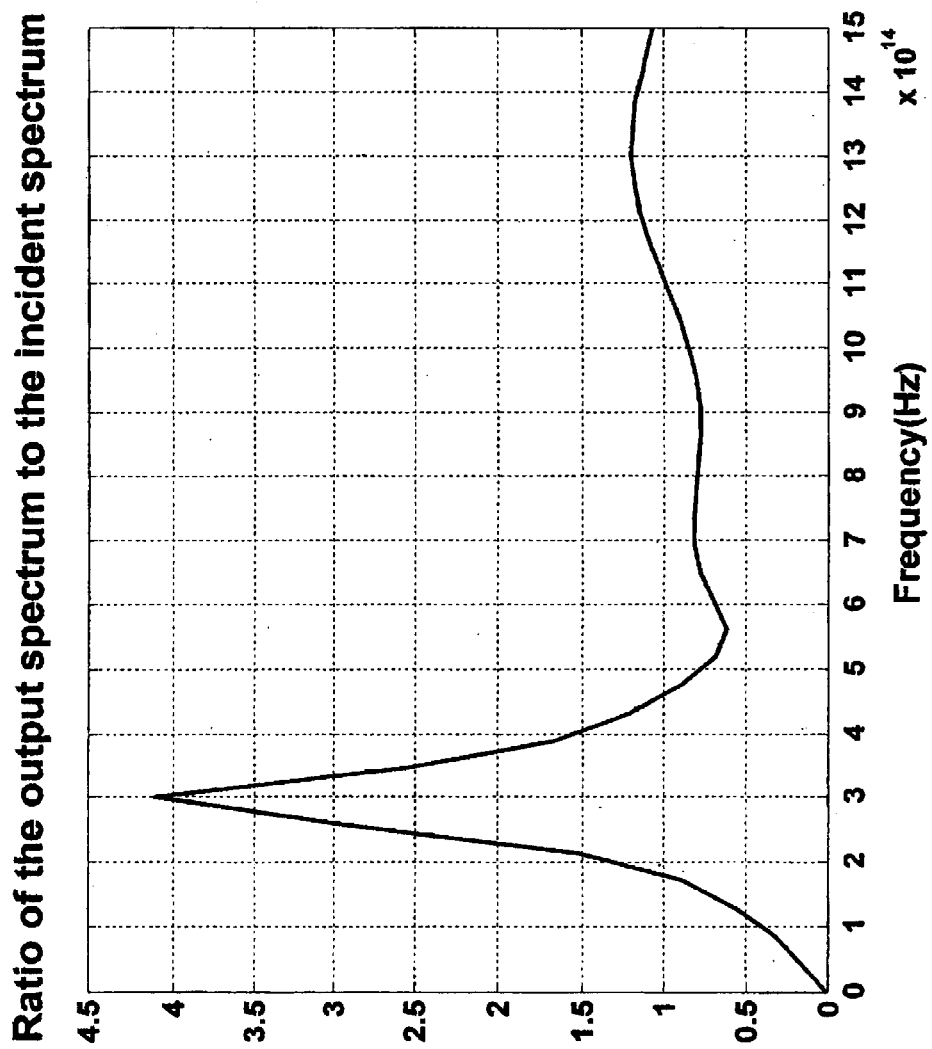
FIG. 18 is a graphical representation of the normalized spectra of FIG. 17, shown as relative intensity versus frequency.

FIG. 16 graphically illustrates relative field strength versus time for a pulsed plane wave incident on, and the resulting output from, the aperture of FIG. 2. FIG. 17 shows graphically the Fourier transforms of the incident and output fields of FIG. 16, as relative field strength versus frequency. FIG. 18 graphically shows the normalized spectra of FIG. 17, shown as relative intensity versus frequency. From FIG. 16 through FIG. 18, the presence of a resonance effect in the aperture 18 can be clearly seen.

Figure 19:
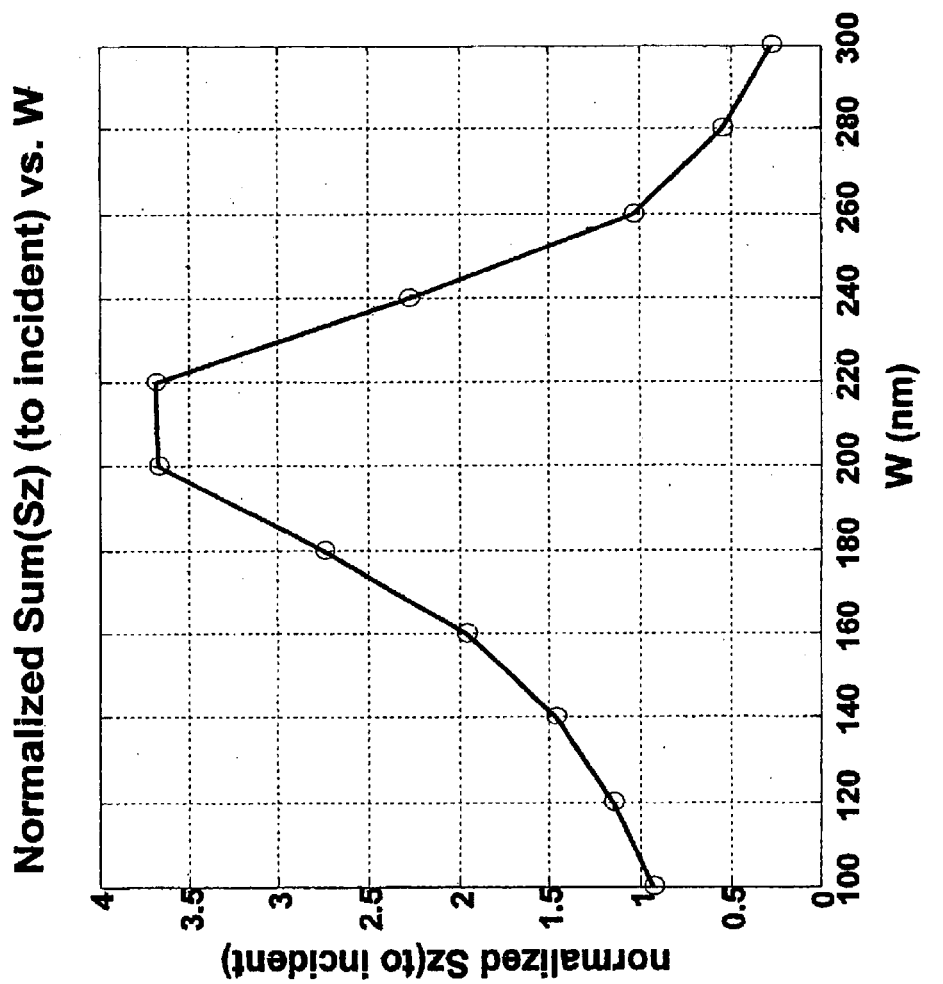
FIG. 19. is a graphical representation of normalized power output versus overall aperture width for the aperture of FIG. 2.
Figure 20:
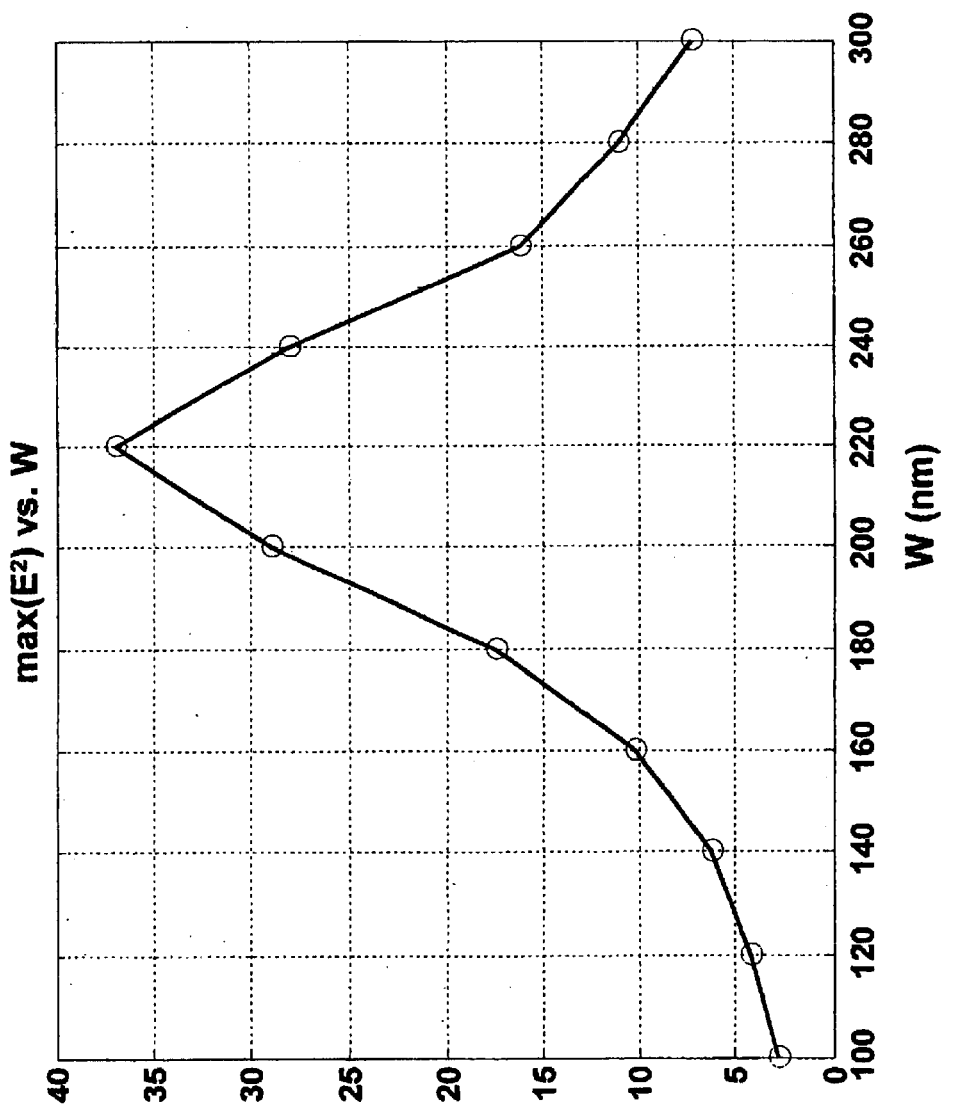
FIG. 20 is a graphical representation of normalized $E^2$ field versus overall aperture width for the aperture of FIG. 2.
Figure 21:
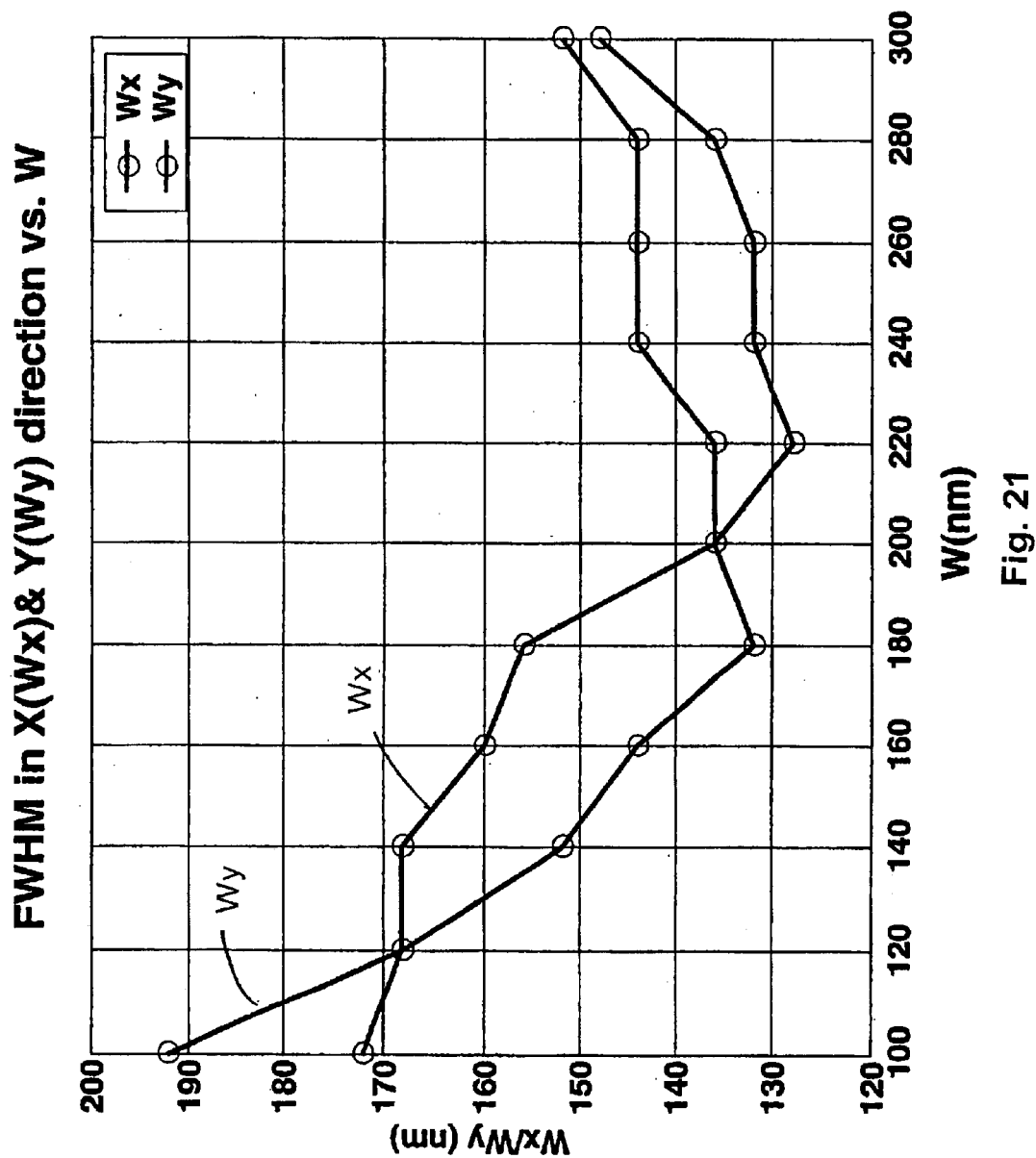
FIG. 21 is a graphical representation of full width half maximum dimensions in x and y directions versus overall aperture width for the aperture of FIG. 2.
Figure 22:
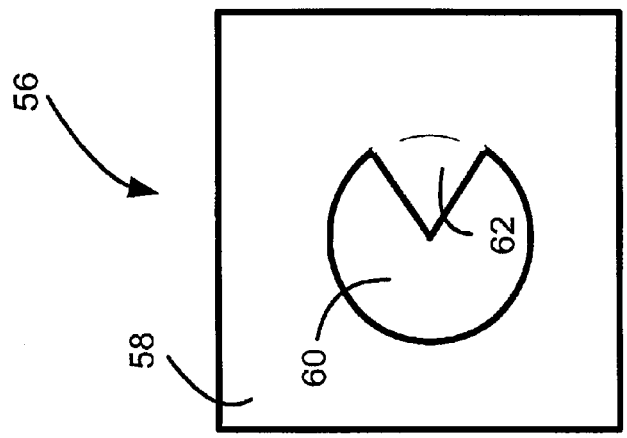
FIG. 22A through FIG. 22C are schematic illustrations of alternative embodiment apertures in accordance with the invention wherein a single protrusion of the surrounding conductive plane extends into the aperture.
Figure 22:
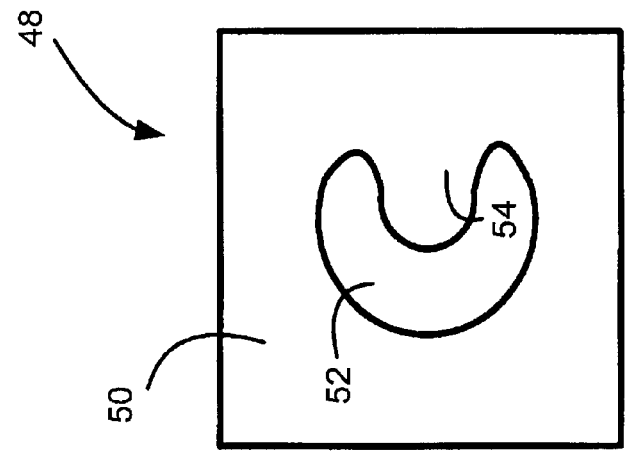
Figure 22:
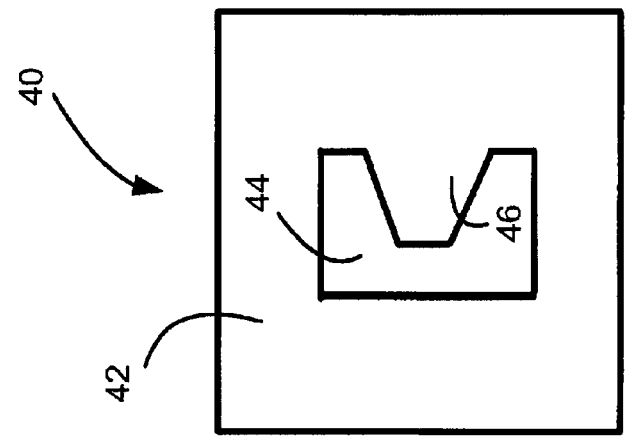

In FIG. 19, normalized power output (Sz) versus aperture width is shown graphically for the aperture 18 of FIG. 2, for λ=1000 nm. The output power density peaks generally for an aperture width of about 220 nm for the aperture shape of FIG. 2 at λ=1000 nm. This aperture width corresponds to a perimeter length of approximately 1280 nm for aperture 18, which, accounting for fringing field effects, corresponds to a perimeter length of approximately one wavelength λ. FIG. 20 graphically provides the normalized $E^2$ field versus aperture width for the aperture of FIG. 2 at λ=1000 nm. As with power density, the normalized $E^2$ field peaks generally at the resonance dimension for aperture 18, where the aperture width is approximately 220 nm.

From the above, the effectiveness of having an aperture perimeter dimension at resonance with the output wavelength can be seen. The particular aperture dimensions noted above are only exemplary, and the dimensions will vary according to the desired output wavelength and details of the aperture shape, as will be readily understood by those skilled in the art.

While resonance is an important consideration, the aperture configuration also must take areal effects into consideration as well. Generally, as the total aperture area decreases, the total emission throughput will increase, and thus overall aperture area should remain as large as possible. Aperture areal effects are most important for apertures of dimensions which are larger than the output wavelength.

The localization and maximizing of near field brightness or intensity is another consideration in aperture design which can be controlled by aperture shape in accordance with the invention. The size and geometry or structure of the aperture and emission facet ideally should be configured to localize and maximize the total field intensity of $E_x^2 + E_y^2 + E_z^2$ at near field distances from the aperture. To this effect, the inclusion of one or more protrusions into the aperture, as provided by the invention, has been found to provide control of field localization. The configuration of aperture 18, with a stub or tongue 20 which extends into the aperture to define regions 22, 24, is a particularly effective arrangement for providing near field localization. The optimum dimensions for field localization for the aperture configuration of FIG. 2 can be seen from FIG. 21, which graphically illustrates the full width half maximum dimensions in x- and y-directions versus aperture width. For the aperture 18, optimum localization occurs at an aperture width of approximately 220 nm. This corresponds generally to the aperture width for perimeter resonance at λ=1000 nm, as noted above. The optimum width for aperture 18 will of course vary with wavelength.

Numerous variations on the aperture configuration of FIG. 2 will also provide good near field localization in accordance with the invention. In FIG. 22A there is shown an alternative embodiment near field optical apparatus 40 having a conductive plane 42 with an aperture 44 therein, and with a tongue or protrusion 46 of conductive plane 42 extending into aperture 44. In the apparatus 40, the protrusion 46 is trapezoidal in shape such protrusion 46 is configured as a truncated point.

Referring to FIG. 22B, another alternative embodiment near field optical apparatus 48 is shown. In the apparatus 48, a conductive sheet 50 includes an aperture 52 extending therethrough, with a protrusion 54 extending into aperture 52. In the apparatus 48, the aperture 52 is rounded in shape, and protrusion 54 is also rounded in shape.

Referring also to FIG. 22C, another preferred near field optical apparatus 56 in accordance with the invention is shown. The apparatus 56 includes a conductive layer 58 with an aperture 60 therein, and a protrusion 62 of conductive plane 58 extending into aperture 60. In the apparatus 56, the aperture 60 is rounded in shape, and protrusion 62 is pointed or generally triangular in shape. Various other aperture configurations based on the above considerations will suggest themselves to those skilled in the art, and are considered to be within the scope of this disclosure.

The effect of aperture shape on near field localization can also be seen from the aperture structures and corresponding field plots shown in FIG. 23 through FIG. 27. In FIG. 23A, a near field optical apparatus 64 in accordance with the invention. The apparatus 64 includes a conductive sheet 65 with an aperture 66 therein, with first and second protrusions or stubs 67a, 67b extending into aperture 66 from generally opposite sides thereof. Protrusions 67a, 67b define and separate first and second regions or slots 68a, 68b which are joined by a centrally located waist or connector region 69. Slot 68a has a length $L_1$, and slot 68b has a length $L_2$. In the embodiment of FIG. 23A, $L_1$ is generally equal to $L_2$, with $L_1$ and $L_2$ being equal to the overall aperture width, and with $L_1$ and $L_2$ each being greater than the width W of waist 69.

In the particular embodiment shown in FIG. 23a, $L_2$, and $L_1$ are equal to approximately 2W. In other embodiments, $L_2$, and $L_1$ need not be equal.

Figures 24A, 24B, 24C:
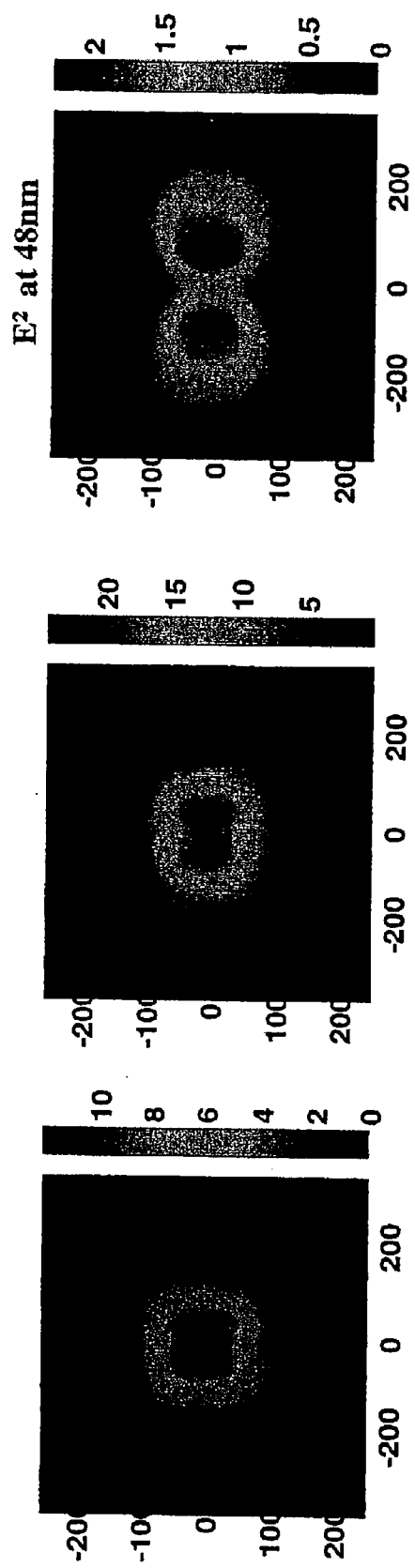
FIG. 24A through FIG. 24C are field plots of normalized $E^2$ field for the apertures of FIG. 23A through FIG. 23C.

FIG. 24A is a field plot of normalized $E^2$ field for the aperture 66 of FIG. 23A for $\lambda=1000$ nm, W=100 nm, and $L_2=L_1=200$ nm, at a distance of approximately W/2 (50 nm) from aperture 66. The direction of light polarization is in the transverse or x direction. As can be seen in FIG. 24, the use of dual protrusions 67a, 67b results in near field localization which is generally symmetrical about the center of aperture 66, but which defines two distinct lobes which are separated in the x direction. The aperture 18 of FIG. 2 provides better $E^2$ field localization, but with localization being slightly less symmetric about the aperture center. The aperture of FIG. 2 also provides substantially better overall $E^2$ field strength. It should be noted, however, that aperture 66 provides an $E^2$ field strength on the order of 100× greater than that of the simple aperture of FIG. 1.

FIG. 23B, a near field optical apparatus 70 is shown with a conductive sheet 71 having an aperture 72 therein, with first and second protrusions or stubs 73a, 73b extending into aperture 72 from generally opposite sides thereof. Protrusions 73a, 73b define first and second transverse slots 74a, 74b which are joined by a centrally located waist or connector region 75. Slots 74a, 74b are respectively of lengths $L_1$ and $L_2$, with $L_1=L_2>W$. As noted above, these particular dimensions may be varied.

FIG. 24B is a field plot of normalized $E^2$ field for the aperture 72 of FIG. 23B, for $\lambda=1000$ nm, W=100 nm, and $L_2, =L_1=300$ nm, at a distance of approximately W/2 (50 nm) from aperture 72, with direction of light polarization being in the transverse or x direction. The dual protrusions 73a, 73b, together with the longer length of transverse slots 74a, 74b provides symmetrical near field localization but with two distinct lobes in the $E^2$ field which are separated in the x direction to a greater extent than provided by the aperture 66 of FIG. 23A.

FIG. 23C shows another near field optical apparatus 76 wherein a conductive sheet 77 includes an aperture 78, with first and second protrusions 79a, 79b extending into aperture 78 from generally opposite sides. Protrusions 79a, 79b define first and second transverse slots 80a, 80b which are joined by a centrally located waist or connector region 81, with slots 80a, 80b respectively of lengths $L_1$ and $L_2$, and waist of width W, with $L_1=L_2>>W$ ($L_1=L_2=6W$). The corresponding field plot of normalized $E^2$ field for FIG. 23C is shown in FIG. 24C, for $\lambda=1000$ nm, W=100 nm, and $L_2$, $L_1=600$ nm, at a distance of approximately W/2 (50 nm) from aperture 78, with light polarized in the transverse or x direction. In the case of aperture 78, the $E^2$ field lobes are even further separated in the x direction than occurs for apertures 66, 72. The relatively long transverse slots 74a, 74b are able to support a comparatively large z component of the $E^2$ field which is somewhat poorly localized, and results in relatively large, undesirable full width half maximum dimensions.

In the case of aperture 78, the near field apparatus 76 may be associated with an impedance value, which should be considered when shaping the aperture. The aperture may define a radiative element, in association with a light source as a transmission line, which has an effective impedance, which should ideally be matched through the impedance of the aperture structure, to the impedance of the region into which the radiator is being coupled. In the near field optical apparatus 76, transverse slots 82a, 82b extend to and communicate with the edges of the conductive plane 77, such that protrusions 79a, 79b are electrically isolated from the remainder of conductive plane 77. In this regard, the near field apparatus 76 has some of the features of a short-circuited transmission line. The structure of aperture 78 could be modified so that the apparatus 76 provides non-short-circuited transmission line features. This would be provided by providing an additional connector region (not shown) which joins first ends 82a, 83b of first and second transverse slots 80a, 80b, and an additional connector region (also not shown) which joins the second ends 82b, 83b of slots. The additional connector regions would have generally the same dimensions of connector region 81.

Referring to FIG. 25A, there is shown a near field optical apparatus 84 having a longitudinally elongated aperture 86 in a conducting plane 85. In the case of apparatus 84, the aperture 86 may be considered as having first and second regions 87a, 87b joined by a waist 88 of width W, wherein the lengths $L_1$ and $L_2$ of regions 87a, 87b are such that $L_1=L_2=W$, with no protrusions extending into the aperture 86. The corresponding field plot of normalized $E^2$ field for the apparatus of FIG. 25A is shown in FIG. 25B, for $\lambda=1000$ nm at a distance of approximately W/2 (50 nm) from the aperture 86, with $L_1=L_2=W=100$ nm, with light polarized in the transverse or x direction. In the case of aperture 86, the $E^2$ field is substantially localized at the aperture center, with a slight definition of lobes in the x direction. The elongation of aperture 86 in the direction perpendicular to the polarization direction takes maximum advantage of polarization effects on $E^2$ field strength. This structure provides an $E^2$ field strength on the order of 100× greater than that of the simple aperture of FIG. 1.

Referring next to FIG. 26A, there is shown yet another preferred embodiment near field optical apparatus 89 in accordance with the present invention. The apparatus 29 includes a conductive sheet 90 having an aperture 91 therein. Aperture 91 is generally annular in configuration, with first and second transverse slots 92a, 92b joined together by first and second connector regions 93a, 93b. An insular or isolated portion 94 of conductive plane 90 is surrounded by slots 92a, 92b and connector regions 93a, 93b, such that conductive portion 94 is electrically isolated from the surrounding conductive plane 90. The island 94 may be considered as a protrusion of conductive plane 90 which has been electrically isolated therefrom by connector regions 93b.

FIG. 26B shows the corresponding field plot of normalized $E^2$ field for the apparatus 89, for $\lambda=1000$ nm at a distance of approximately W/2 (50 nm) from the aperture 86, with transverse slots 92a, 92b being 300 nm in length, with the width of connector regions being 100 nm, and with light polarized in the transverse or x direction. The apparatus 89 provides a relatively large aperture area and good polarization transmission through slots 92a, 92b which are not shorted at the ends (as in the apparatus 76 of FIG. 23C). The $E^2$ field is localized to a pair of regions or lobes located to the left and right of central conductor island 94. The apparatus 89, it should be noted, provides an $E^2$ field strength on the order of 100× that of the simple square aperture of FIG. 1.

The near field optical apparatus of the invention may be used with a variety of light sources, and is particularly well suited to use in semiconductor laser devices where the conducting plane surrounding the aperture can comprise a metal layer on the laser emission facet. The invention, as embodied in a vertical cavity surface emitting laser (VCSEL), is described in detail below. It should be kept in mind, however, that a VCSEL device is merely one preferred embodiment of the invention, and that edge emitting and other solid state lasers, as well as other light sources generally, may be used with the invention.

Figure 27:
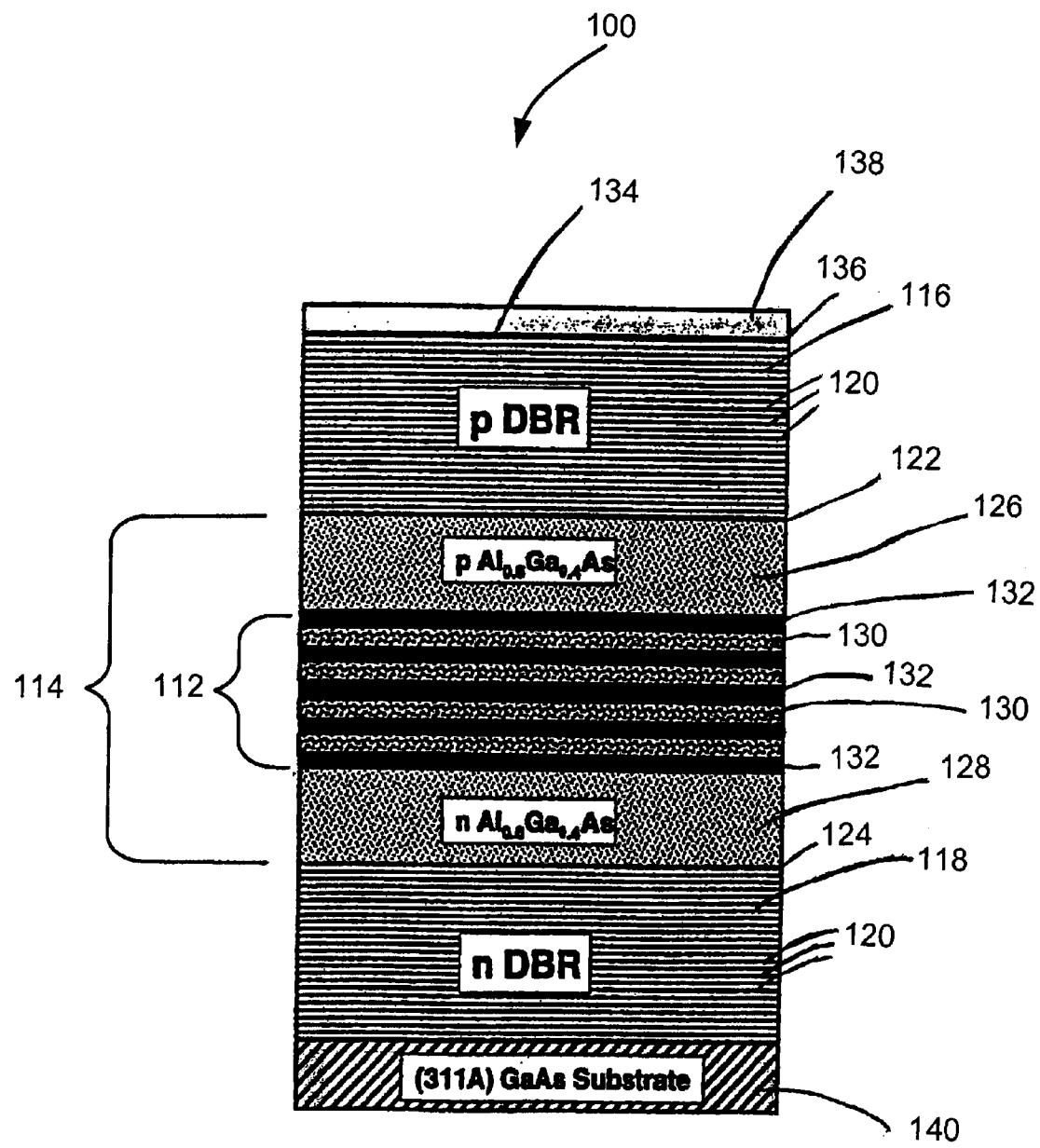
FIG. 27 is a schematic side elevation view in cross-section of a prior art vertical cavity surface emitting laser.

The invention as embodied in a VCSEL will be more fully understood by first reviewing the structure and properties of conventional vertical cavity surface emitting lasers or VCSEL devices. Referring to FIG. 27, there is shown a prior art AlGaAs VCSEL device 100 which is structured and configured for operation at approximately 821.8–821.9 nm, The VCSEL device 100 includes an active region 112 within an optical cavity 114, an upper, first conductivity type distributed Bragg reflector or DBR mirror 116, and a lower, second conductivity type DBR mirror 118. Upper and lower DBR mirrors 116, 118 each include a plurality of dielectric layer pairs 120. The dielectric layer pairs 120 are generally quarter wave or $\lambda/4$ $Al_{0.16}Ga_{0.84}As/Al_{0.96}Ga_{0.04}As$ pairs. The thickness of various layer components of VCSEL 10 are exaggerated for clarity, and thus it should be understood that the particular layer thicknesses shown are merely illustrative and are not necessarily to scale.

The laser or optical cavity 114 is defined generally by the lower edge 122 of upper DBR mirror 116 and the upper edge 124 of lower DBR mirror. A p-doped $Al_{0.6}Ga_{0.4}As$ layer 126 within optical cavity 114 is positioned between upper DBR mirror 116 and active region 112, and an n-doped $Al_{0.6}Ga_{0.4}As$ layer 128 is positioned within optical cavity 114 between lower DBR mirror 118 and active region. Active region 112 is shown with a plurality of $Al_{0.05}Ga_{0.95}As$ quantum wells 130 and $Al_{0.4}Ga_{0.6}As$ quantum barriers 132, which may range in thickness generally within the range of 2–20 Å. The n-doped and p-doped $Al_{0.6}Ga_{0.4}As$ regions 124, 126 define a diode structure so that lasing within optical cavity 14 can be turned on and off by varying current through the active region with respect to a threshold current in a conventional manner.

An emission facet or face 134 is defined at the upper surface 136 of upper DBR mirror 116. A GaAs cap or coating 138 is typically included on top of emission facet 134. The VCSEL 100 also generally includes a bottom GaAs substrate 140 upon which the other layers structures of VCSEL 100 are deposited or "grown". An encapsulant material (not shown) is generally included adjacent the sides of VCSEL 100.

The upper DBR mirror 116 generally includes fewer dielectric layer pairs 120 than lower DBR mirror 118, so that optical power can be extracted from emission facet 134. For example, upper DBR mirror 116 may comprise twenty five dielectric layer pairs 120, while lower DBR mirror 116 comprises thirty five dielectric layer pairs 120 in a typical laser structure. Stacked dielectric DBR mirrors 116, 118 have very high reflectivity, typically in excess of 99.5%. As a result, the optical power recirculating within laser cavity 114 is generally a factor of 100 to 10,000 greater than the optical power extracted through emission facet 34. Upper DBR mirror presents the dominant loss for VCSEL 110 and represents the path through which output power is extracted.

Figure 28:
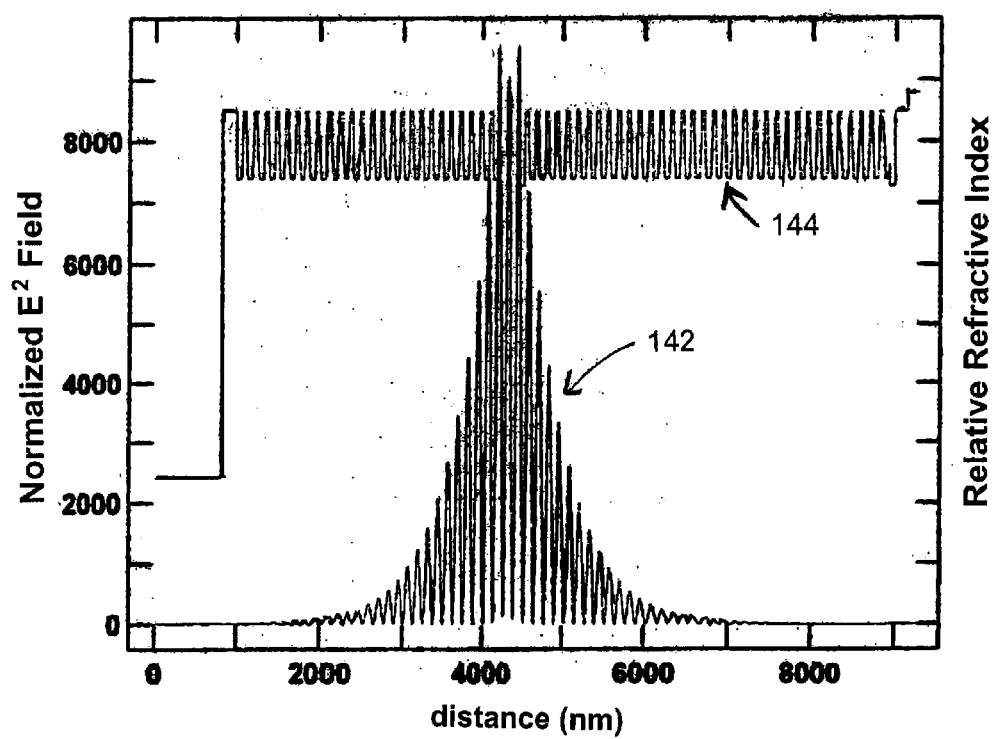
FIG. 28 is a graphic representation of the optical field profile, shown as normalized $E^2$ versus distance from the edge of the laser cavity, and refractive index profile, shown as refractive index versus distance from the edge of the laser cavity, for the prior art vertical cavity surface emitting laser of FIG. 1.

The distribution of the optical field in VCSEL 100 as a function of depth within the laser structure is illustrated graphically in FIG. 28 as normalized $E^2$-field versus distance from the center of optical cavity 114. FIG. 28 shows an optical field profile 42 of the longitudinal standing wave within optical cavity 114 superimposed with a refractive index profile 144 for upper DBR mirror 16 with twenty five $\lambda/4$ layer pairs. The right hand y-axis of FIG. 2 represent relative refractive index. The standing wave pattern of optical field profile 42 is characterized by a series of peaks and nulls, with the amplitude of the peaks increasing monotonically as the center of resonance cavity 14 is approached. Optical field profile 42 exhibits a peak $E^2$-field of about 9598 and a bottom $E^2$-field of about 12 normalized units with respect to the bottom DBR mirror.

Referring also to Table 1 below, Column 1A, there are shown several standard performance parameters calculated for VCSEL 100, having twenty five $\lambda/4$ layer pairs in upper DBR mirror 116, thirty five $\lambda/4$ layer pairs in lower DBR mirror 118, and emitting at 821.868 nm, as would be used, for example, for data communication applications. The $E^2$ field parameters provided in Table 1 are normalized relative to the bottom DBR mirror 118. Note again that upper DBR mirror 116 presents the dominant loss for VCSEL 100. In a well designed VCSEL device, this loss will represent the predominant loss mechanism in the laser cavity.

If the VCSEL 100 is structured and configured such that upper DBR mirror 116 had greater reflectivity than in the above example, the total losses in the VCSEL, and the threshold current for the VCSEL, would be reduced. Such a VCSEL, however, would have reduced efficiency at moderate output levels, as the upper mirror loss will be less predominant with respect to other cavity losses. Referring to Column 1B of Table 1, there are shown calculated laser performance parameters for VCSEL 10 wherein upper DBR mirror 116 comprises thirty five $\lambda/4$ pairs to provide increased upper mirror reflectivity.

TABLE 1

|  | Conventional VCSEL (25 $\lambda/4$ pair upper DBR) Column 1A | VCSEL With Increased Top Mirror Reflectivity Column 1B |
| --- | --- | --- |
| Upper $\lambda/4$ Pairs | 25 | 35 |
| Lower $\lambda/4$ Pairs | 35 | 35 |
| Threshold Gain (cm$^{-1}$) | 312.586 | 227.824 |
| Wavelength (nm) | 821.868 | 821.868 |
| External Efficiency (Total) | 0.3965115 | 0.171773 |
| External Efficiency (Bottom) | 0.0337275 | 0.0938378 |
| External Efficiency (Top) | 0.362788 | 0.0779357 |
| Round Trip Net Gain | 0.00529864 | 0.00380674 |
| Round Trip Net Loss | 0.00319765 | 0.00315284 |
| Round Trip Transmission | 0.00210099 | 0.000653897 |
| Transmission Down | 0.00017871 | 0.000357216 |
| Transmission Up | 0.00192228 | 0.000296681 |
| Active Region Thickness (nm) | 16.0488 | 16.0488 |
| Gain Enhancement Factor | 5.2814 | 5.20573 |
| Normalized Peak $E^2$ Field | 9598.54 | 9590.45 |
| Normalized $E^2$ Field at Active Region | 9050.11 | 9042.51 |
| Normalized Top $E^2$ Field | 12.0265 | 0.927765 |
| Normalized Bottom $E^2$ Field | 1.11807 | 1.11707 |
| Surface-Peak Field Ratio | 0.001328879 | 0.0001026 |
| Intensity Enhancement | 1 | 0.077208229 |
| Top Surface Reflectivity | 0.99807772 | 0.999703319 |

TABLE 2

| | VCSEL With Reduced Top Mirror Reflectivity (15 λ/4 pair upper DBR) Column 2A | VCSEL With Reduced Top Mirror Reflectivity (15 λ/4 pair upper DBR) Column 2B |
|---|---|---|
| Upper λ/4 Pairs | 15 | 11 |
| Lower λ/4 Pairs | 35 | 35 |
| Threshold Gain (cm$^{-1}$) | 1405.31 | 3522.52 |
| Wavelength (nm) | 821.875 | 821.889 |
| External Efficiency (Total) | 0.867193 | 0.947815 |
| External Efficiency (Bottom) | 0.00442919 | 0.000932462 |
| External Efficiency (Top) | 0.862764 | 0.946882 |
| Round Trip Net Gain | 0.023863 | 0.0599235 |
| Round Trip Net Loss | 0.00316917 | 0.00312712 |
| Round Trip Transmission | 0.0206938 | 0.0567964 |
| Transmission Down | 0.000105694 | 0.000055876 |
| Transmission Up | 0.0205881 | 0.0567405 |
| Active Region Thickness (nm) | 16.0488 | 16.0488 |
| Gain Enhancement Factor | 5.29029 | 5.29995 |
| Normalized Peak E$^2$ Field | 12986.3 | 21878.5 |
| Normalized E$^2$ Field at Active Region | 12243.8 | 20627 |
| Normalized Top E$^2$ Field | 210.758 | 989.224 |
| Normalized Bottom E$^2$ Field | 1.08197 | 0.974159 |
| Surface-Peak Field Ratio | 0.017213447 | 0.047957725 |
| Intensity Enhancement | 12.95336025 | 36.08886122 |
| Top Surface Reflectivity | 0.9794119 | 0.9432595 |

If VCSEL 100 is structured and configured such that upper DBR mirror 116 had reduced reflectivity, by having fewer λ/4 pairs, the upper mirror losses would be increased, and the laser threshold current would be increased. Referring to Table 2 above, Column 2A, there are shown laser performance parameters calculated for VCSEL 10 wherein upper DBR mirror 116 comprises fifteen λ/4 pairs. The E$^2$ Field values in Table 2 are normalized with respect to the bottom DBR mirror 118. Column 2B of Table 2 further shows calculated performance parameters for VCSEL 100 wherein upper DBR mirror 116 includes only eleven λ/4 pairs. In these cases, the laser threshold current is increased to the extent that laser operation may not occur before the advent of excess heating and quantum well gain saturation occur which will prevent lasing.

With the above properties for high and low reflectivity upper DBR mirrors 116, 118 in mind, it can be seen that a VCSEL having an upper mirror region of lower reflectivity dimensioned smaller than the guide mode of the laser structure, surrounded by an upper mirror region of higher reflectivity, to provide performance parameters corresponding to both high and low upper mirror reflectivity models. This can be achieved by etching or otherwise creating an aperture in the emission face of the VCSEL which extends into the upper DBR mirror and having dimensions smaller than the dimension of the laser guide mode of the VCSEL structure. The emission facet would then present two regions of differing reflectivities. The region surrounding the aperture would have a high reflectivity and properties similar to those illustrated in Column 1B in Table 1. The region under the aperture, having a smaller number of λ/4 pairs, would have a lower reflectivity and properties like those illustrated in Columns 2A and 2B of Table 2.

A reasonable approximation of the net upper mirror reflectivity can be provided by a weighted average integral of reflectivity as a function of position on the emission facet, according to the area of the aperture relative to the size of the optical mode. For an aperture of a particular or given area, the depth of the aperture could be selected and adjusted such that a particular target loss can be achieved. This can be seen by comparing the parameters of Columns 2A and 2B of Table 2 for the VCSEL structures having upper mirror thicknesses of fifteen and eleven λ/4 pairs respectively. In particular, if the desired or target value of loss is the same value as the mirror loss for the conventional VCSEL structure 100 with twenty five upper mirror λ/4 pairs as shown in Column 1A of Table 1, the same power would be extracted from an apertured upper mirror as would be from the conventional non-apertured upper mirror. In other words, the output power extracted through a VCSEL having an apertured emission facet can be achieved which is equal to the output power extracted from the conventional VCSEL 10 having a flat or planar emission facet.

Figure 29:
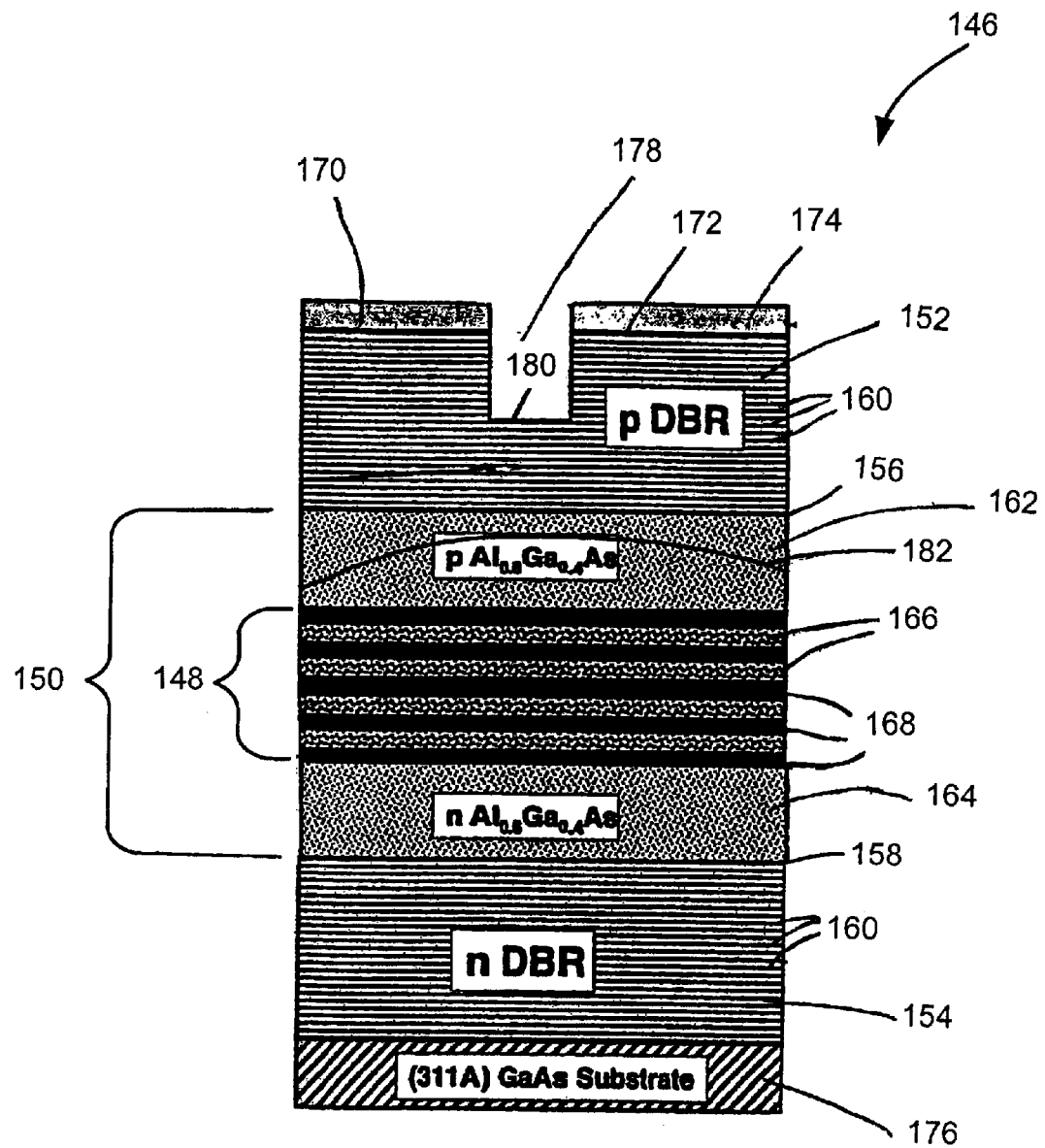
FIG. 29 is a schematic side elevation view in cross-section of a vertical cavity surface emitting laser in accordance with the present invention.
Figure 30:
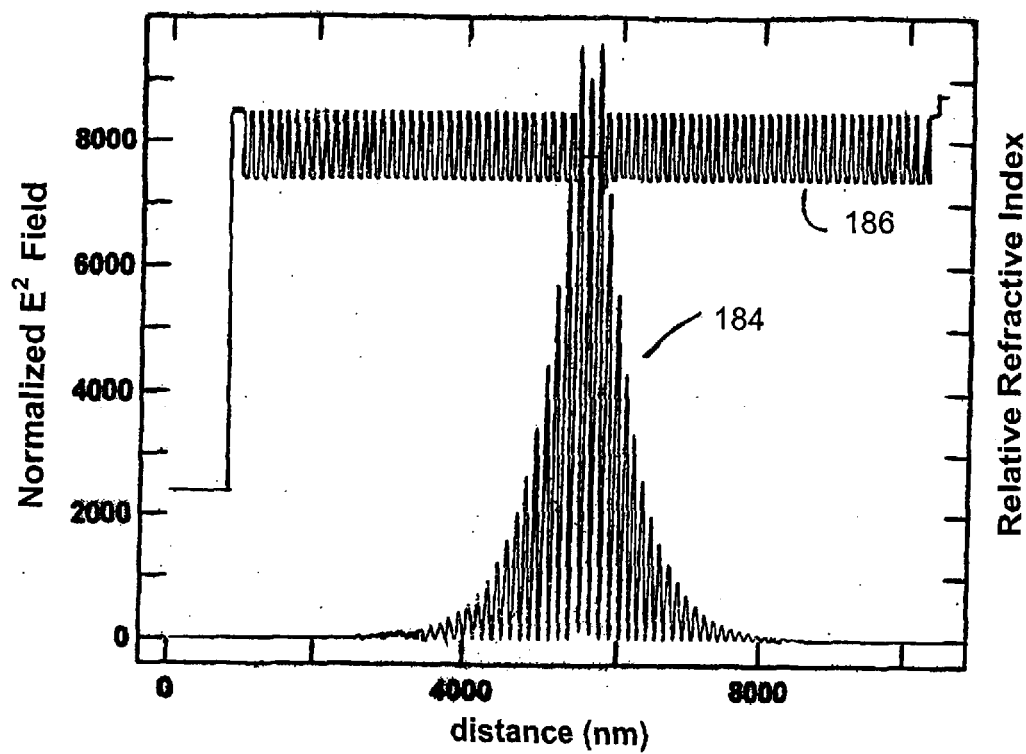
FIG. 30 is a graphic representation of the optical field profile, shown as normalized $E^2$ versus distance from the edge of the laser cavity, and refractive index profile, shown as refractive index versus distance from the edge of the laser cavity, for the area surrounding the aperture of the vertical cavity surface emitting lasers of FIG. 3.

Referring now to FIG. 29, a vertical cavity surface emitting laser or VCSEL 146 in accordance with the present invention is shown. VCSEL 146 is shown as a GaAlAs device structured and configured for output at approximately 821.9 nm, and it should be readily understood that the layer thicknesses and semiconductor materials used for VCSEL 146 may vary as required for different applications. Thus, VCSEL 146 may be fabricated from various semiconductor materials, including, for example, GaAs, InGaAs, InGaAsP and InP materials, and can be structured and configured to provide various output wavelengths. The thicknesses of various layer components of VCSEL 146 as shown in FIG. 29 are exaggerated for clarity, and the particular layer thicknesses shown are merely illustrative and are not necessarily to scale.

VCSEL 146 comprises an active region 148 centered within a laser cavity 150. An upper, p-doped distributed Bragg reflector or DBR mirror 152 is positioned adjacent the top of cavity 150, and a lower n-doped DBR mirror 154 is positioned adjacent the bottom of cavity 150. Laser cavity 150 is thus defined generally by a lower edge 156 of upper DBR mirror 152 and an upper edge 158 of lower DBR mirror 154, and is shown as a one-wavelength λ cavity. Upper and lower DBR mirrors 152, 154 each comprise a plurality of dielectric layer pairs 160 which, in this example, are preferably quarter wave or λ/4 $Al_{0.16}Ga_{0.84}As$/$Al_{0.96}Ga_{0.04}As$ layer pairs.

VCSEL 146 preferably comprises a p-doped $Al_{0.6}Ga_{0.4}As$ layer 162, which is positioned within optical cavity 150 between upper DBR mirror 152 and active region 48, and an n-doped $Al_{0.6}Ga_{0.4}As$ layer 164 which is positioned within optical cavity 150 between lower DBR mirror 154 and active region 148. Active region 148 preferably comprises a single or plurality of quantum well, quantum wire, quantum do, and/or other quantum nanostructures. Active region 148 is shown with a plurality of $Al_{0.05}Ga_{0.95}As$ quantum wells 166 and $Al_{0.4}Ga_{0.6}As$ quantum barriers 168, which may range in thickness generally within the range of 2–20 Å.

VCSEL 146 also comprises an emission facet or face 170, which is defined at the upper surface 172 of upper DBR mirror 116. A GaAs cap 174 is included on top of emission facet 170. A bottom GaAs substrate 176 is present adjacent lower DBR mirror 154. An encapsulant material may be included adjacent the sides of VCSEL 146.

An opening or aperture 178 is included in emission facet 170 of VCSEL 146, with aperture 178 extending through GaAs cap 174 and into upper DBR mirror 152. As a result, there are a smaller number of λ/4 layer pairs 160 positioned between the bottom 180 of aperture 178 and lower edge 156 of upper DBR mirror 152, than are positioned between emission facet 170 and lower edge 156 of upper DBR mirror 152. The dimensions of aperture 178 are generally smaller or less than that of the guide mode 182 of VCSEL 146.

The area of emission facet 170 associated with aperture 178 thus provides a region of lower reflectivity, while the region surrounding portions of emission facet 170 present a region of higher reflectivity, as discussed above. When upper DBR mirror comprises thirty five λ/4 layer pairs 160, the region surrounding aperture 178 will exhibit generally the parameters of Column 1 of Table 1. In FIG. 29, the distribution of the optical field 184 for the thirty five λ/4 layer pair thick structure surrounding aperture 178, as a function of depth within the laser structure, is illustrated graphically as normalized $E^2$-field versus distance from the edge of optical cavity 150. The refractive index profile 186 for the thirty five λ/4 layer pair, shown as relative refractive index versus distance from edge of optical cavity 150, is shown superimposed with the optical field profile 184. The right hand y-axis shows relative refractive index.

Figure 31:
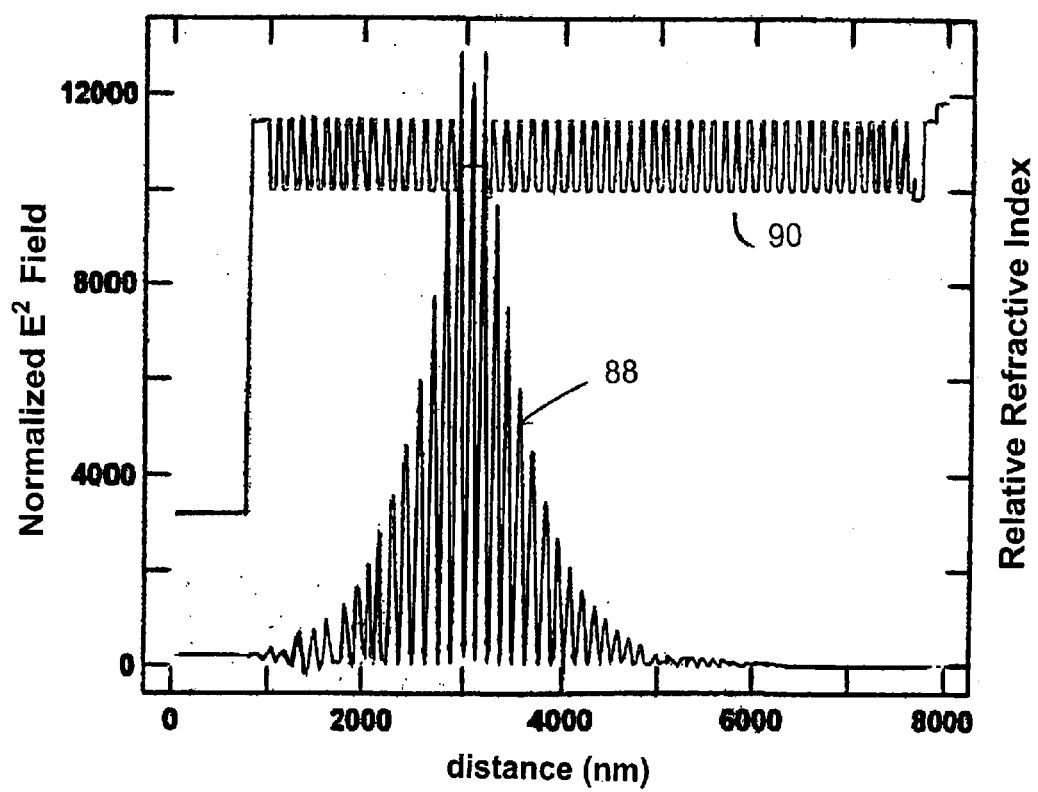
FIG. 31 is a graphic representation of the optical field profile, shown as normalized $E^2$ versus distance from the edge of the laser cavity, and refractive index profile, shown as refractive index versus distance from the edge of the laser cavity, for the area under the aperture of the vertical cavity surface emitting laser of FIG. 3 when fifteen dielectric layer pairs are positioned between the bottom of the aperture and the top of the optical cavity.
Figure 32:
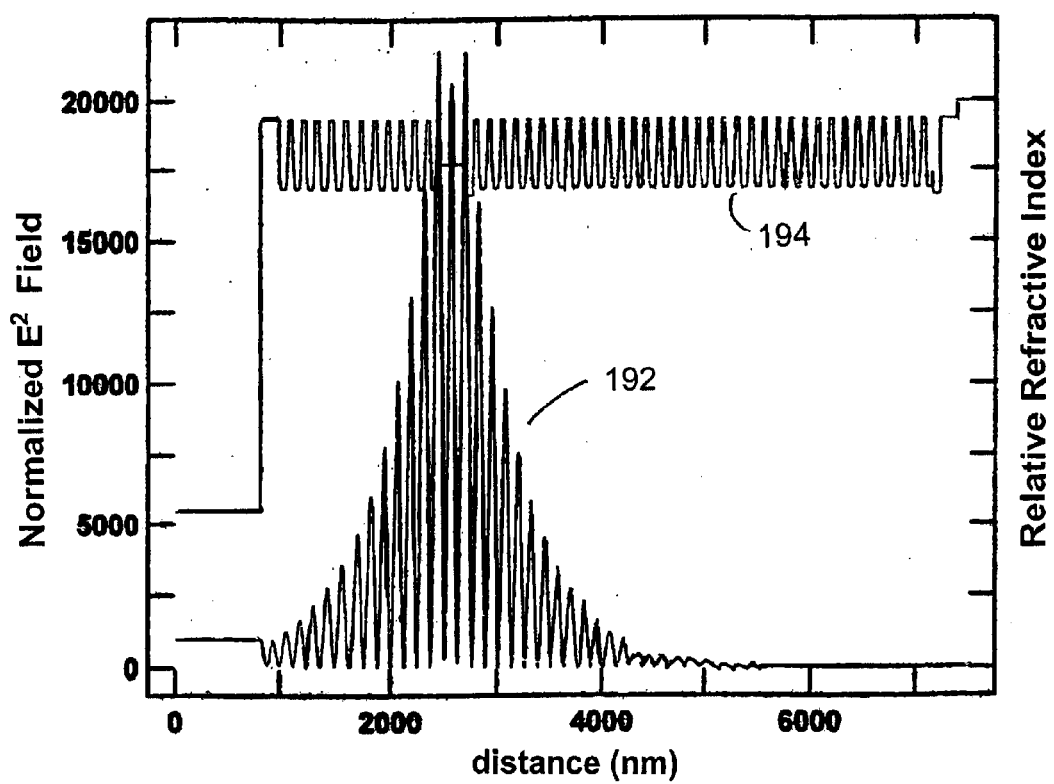
FIG. 32 is a graphic representation of the optical field profile, shown as normalized $E^2$ versus distance from the edge of the laser cavity, and refractive index profile, shown as refractive index versus distance from the edge of the laser cavity, for the area under the aperture of the vertical cavity surface emitting laser of FIG. 3 when eleven dielectric layer pairs are positioned between the bottom of the aperture and the top of the optical cavity.

When aperture 178 is etched into upper DBR mirror 152 to a depth such that fifteen λ/4 layer pairs 160 are present between the bottom 180 of aperture and lower edge 156 of mirror 152, the region defined by aperture 178 will exhibit generally the properties shown in Column 2A of Table 2. When aperture 178 is etched into upper DBR mirror 152 to a depth such that eleven λ/4 layer pairs 160 are present between the bottom 180 of aperture and lower edge 156 of mirror 152, the region defined by aperture 178 will exhibit generally the properties shown in Column 2B of Table 2. As noted above, the depth of aperture 178 can be selected and adjusted such that a particular target loss is achieved for VCSEL 146. By selecting or targeting the loss to equal that of the mirror loss of conventional VCSEL 110, a power output can be extracted from facet 170 of VCSEL 146 which is similar to the power output extracted from the facet 134 of VCSEL 100. FIG. 31 illustrates graphically the optical field profile 188 and refractive index profile 190 for the fifteen λ/4 layer pair structure corresponding to Column 2A, and FIG. 32 illustrates graphically the optical field profile 192 and refractive index profile 194 for the eleven λ/4 layer pair structure of Column 2B.

Aperture 178 will generally extend one to two microns in depth into upper DBR mirror 152, and thus introduces some undesirable scattering losses. One way to reduce such scattering losses is to replace a portion of the λ/4 layer pairs 160 in the region surrounding aperture 178 with a highly reflective metal layer. The metal layer makes up for or replaces the reflectivity of the λ/4 layers which have been replaced. In this case, the aperture extends through the homogeneous reflective metal layer and down to the DBR mirror 152. Since the reflective metal layer is also conductive, it provides a conductive plane such that the aperture may be structured and configured with one or more protrusions of the conductive plane extending into the aperture, as described above.

Figure 33:
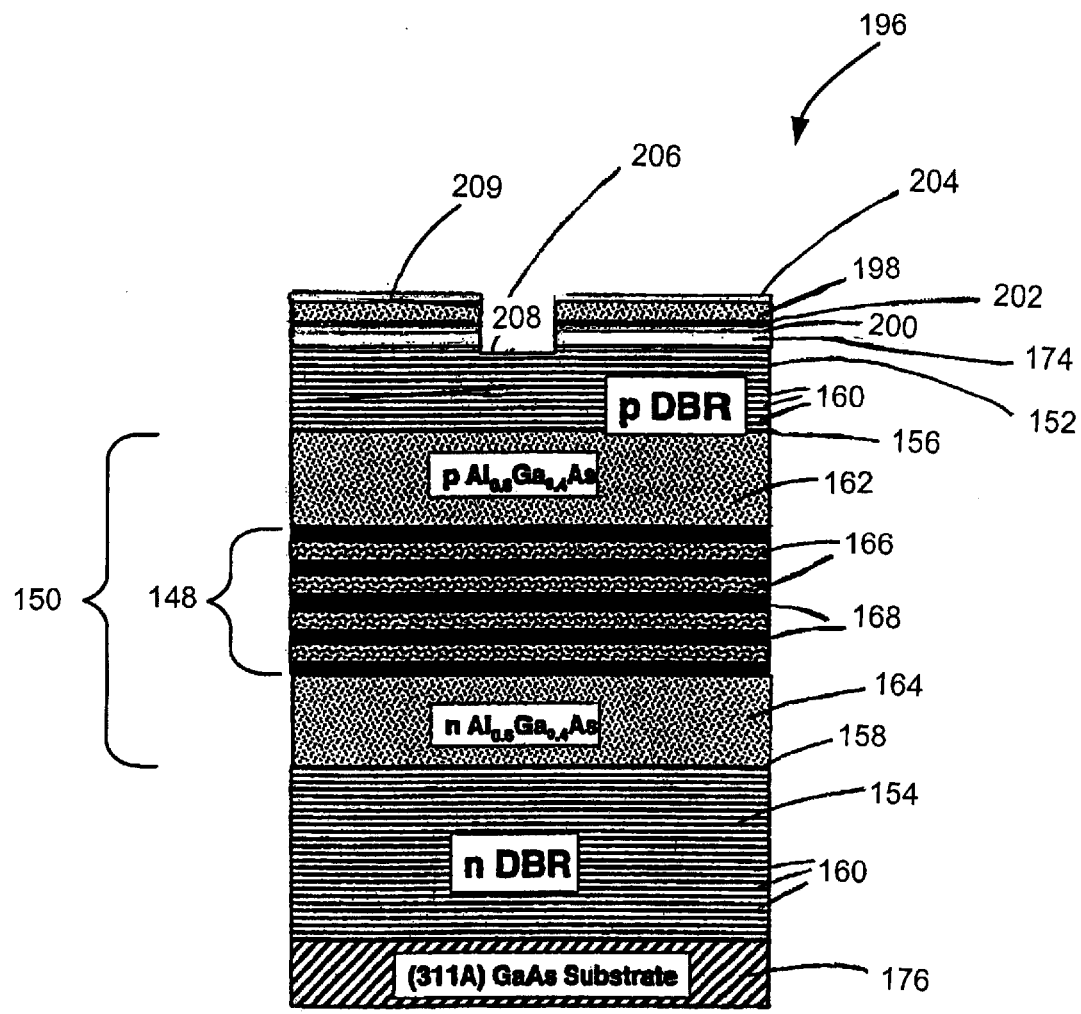
FIG. 33 is a schematic side elevation view in cross-section of an alternative embodiment vertical cavity surface emitting laser in accordance with the present invention.

Referring now to FIG. 33, there is shown an alternative embodiment VCSEL apparatus 196 in accordance with the present invention, with like reference numbers used to designate like parts, which utilizes a highly reflective layer as part of an upper mirror. As in VCSEL 146 described above, the VCSEL 196 in FIG. 33 includes a laser cavity 150 comprising an active region 148 interposed between p- and n-doped $Al_{0.6}Ga_{0.4}As$ layers 162, 164, which in turn are interposed between upper and lower DBR mirrors 152, 154. In VCSEL 196, upper DBR mirror 152 has a smaller number of λ/4 layer pairs 160 than described for VCSEL 146 above.

In this example, upper DBR mirror 152 includes eleven or fifteen λ/4 layer pairs 160. VCSEL 196 includes a highly reflective, conductive metal layer 198, preferably of silver (Ag) or other highly reflective metal, to make for the lessened reflectivity of DBR mirror 152 due to the smaller number of λ/4 layer pairs 160.

The reflective metal layer 198 is preferably about 40 nm in thickness, and is positioned above GaAs cap or layer 174. GaAs layer 174 has a thickness of λ/2. Preferably, a semiconductor layer 200 of $Al_{0.16}GaAs$ of about 16 nm or 94 nm thickness is deposited on top of GaAs layer 174, and insulator spacer layer 202 of $TiO_2$ of about 181 nm thickness is deposited on $Al_{0.16}GaAs$ layer 200, such that $Al_{0.16}GaAs$ layer 200 and $TiO_2$ layer 202 are positioned between GaAs layer 174 and reflective silver Ag layer 198. A layer or coating 204 of $SiO_2$ of about 17 nm thickness is preferably deposited on top of silver layer 198 to act as a passivation layer and prevent oxidation or other reaction with silver layer 198. The particular thicknesses noted above for reflective Ag layer 198, $Al_{0.16}GaAs$ layer 200, $TiO_2$ layer 202, and $SiO_2$ layer 204, are the preferred thicknesses for operation of the invention at an output wavelength λ=approximately 821.8 nm. A thickness of 94 nm is preferably used for $Al_{0.16}GaAs$ layer 200 when fifteen λ/4 pairs are used with upper DBR mirror 152, and a thickness of 16 nm is preferably used for $Al_{0.16}GaAs$ layer 200 when eleven λ/4 pairs are used with upper DBR mirror 152.

The $TiO_2$ layer 202 and $Al_{0.16}GaAs$ layer 200 provide means are for optimizing adhesion of the reflective and conductive Ag layer 198 to GaAs contact layer 174, and means are for reducing reactivity between the reflective and conductive Ag layer and contact layer 174. The use of Ag for reflective layer 198 is presently preferred due to the high reflectivity of Ag. The $TiO_2$ layer 202 and $Al_{0.16}GaAs$ layer 200 employed with the invention aid in the adhesion of the Ag layer 198 in the layered structure of VCSEL 196. The $TiO_2$ layer 202 and $SiO_2$ layer 204 isolate and passivate the Ag metal layer and avoid oxidation, corrosion or other reaction which would otherwise reduce the reflectivity of Ag layer 198.

An aperture 206 is etched through $SiO_2$ layer 204 and Ag layer 198 in order to provide for extraction of optical power. Aperture 206 may comprise a simple square or round aperture, but more preferably comprises an aperture wherein a portion of the reflective, conductive metal layer 198 extends or protrudes into the aperture in the manner described above. For reason of clarity, only a simple aperture is shown in FIG. 33. The depth or bottom 208 of aperture 206 will nominally coincide with the center of the $TiO_2$ layer 202, which is subject to the highest magnitude of electric field. The relative planarity of this structure provides for a reduction of scattering loss when compared to the structure of FIG. 29.

In the region surrounding aperture 206, VCSEL 196 has an upper mirror reflectivity equal to the combined reflectivity of metal layer 202 and the λ/4 layer pairs 160 of upper DBR mirror 152, while the area under aperture 206 has a reflectivity provided only by the λ/4 layer pairs 160 of upper DBR mirror 152. Thus, emission facet 206 present a region of reduced reflectivity which is surrounded by a region of higher reflectivity. As described above, the depth of aperture 206 can be tailored to provide a selected or target loss.

In Table 3 below, Column 3A and Column 3B there are respectively shown parameters for the structure surrounding aperture 206, for an upper DBR mirror 152 having fifteen λ/4 layer pairs 160 and eleven λ/4 layer pairs 160.

Figure 34:
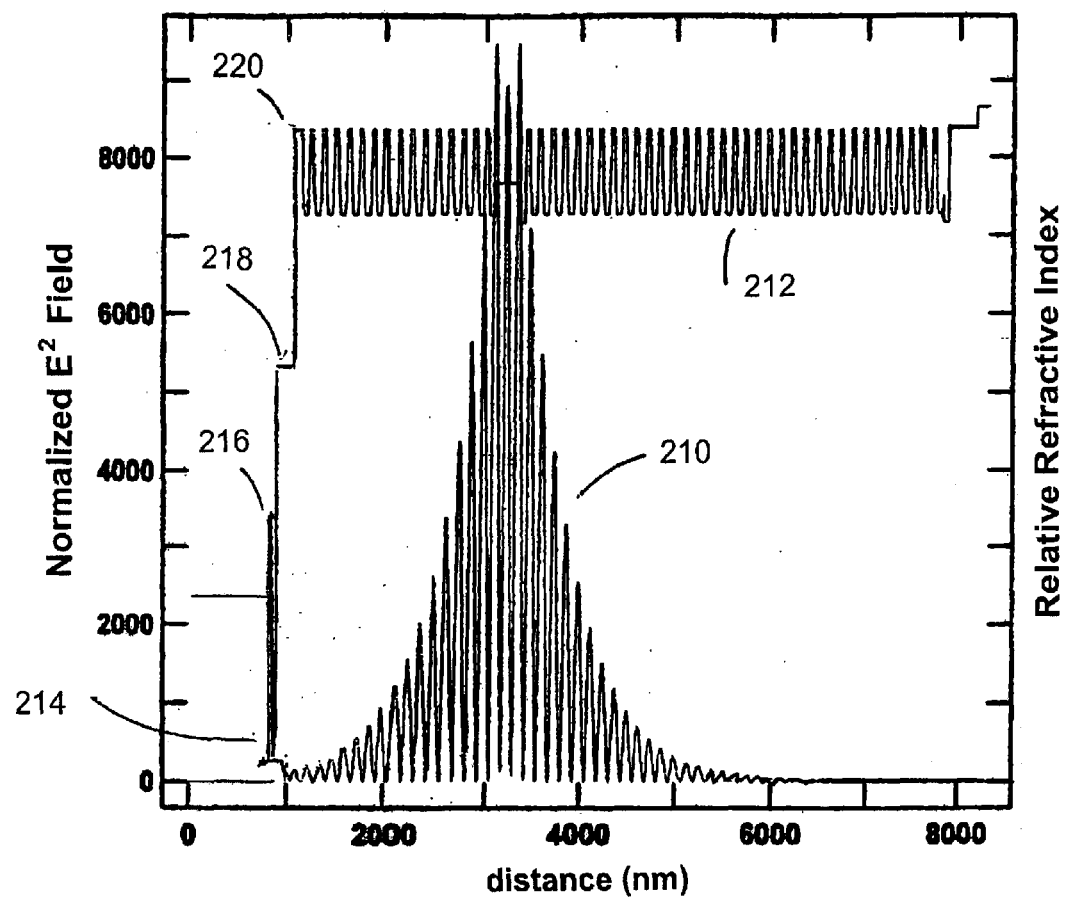
FIG. 34 is a graphic representation of the optical field profile, shown as normalized $E^2$ versus distance from the edge of the laser cavity, and refractive index profile, shown as refractive index versus distance from the edge of the laser cavity, for the area under the aperture of the vertical cavity surface emitting laser of FIG. 7 when fifteen dielectric layer pairs are positioned between the bottom of the aperture and the top of the optical cavity.

FIG. 34 illustrates graphically the optical field profile 210 and refractive index profile 202 for the fifteen λ/4 layer pair and metal layer structure corresponding to Column 3A. The 40 nm thick reflective silver layer 98 has a refractive index profile 214. The 17 nm thick SiO$_2$ layer 209 has a refractive index profile 216. The 181 nm thick TiO$_2$ layer 202 has a refractive index profile 118, and the 94 nm thick Al$_{0.16}$GaAs layer 200 has a refractive index profile 220.

Figure 35:
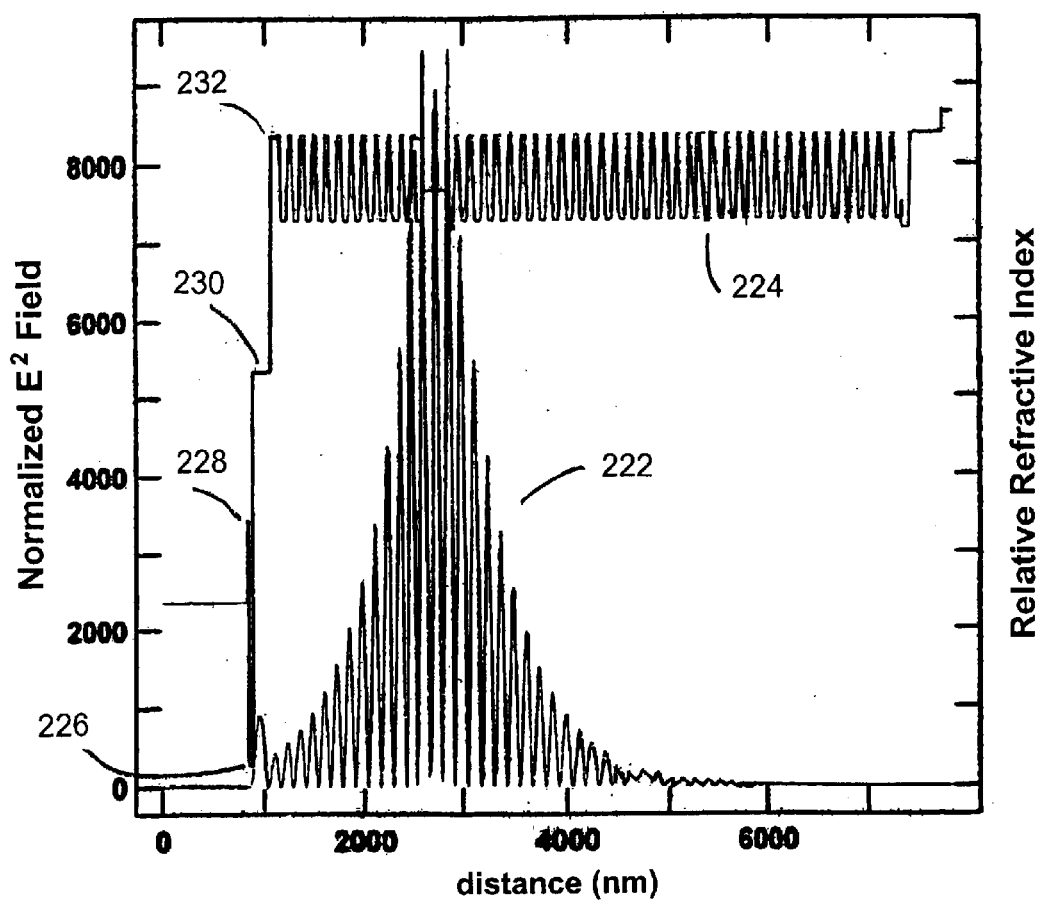
FIG. 35 is a graphic representation of the optical field profile, shown as normalized $E^2$ versus distance from the edge of the laser cavity, and refractive index profile, shown as refractive index versus distance from the edge of the laser cavity, for the area under the aperture of the vertical cavity surface emitting laser of FIG. 7 when eleven dielectric layer pairs are positioned between the bottom of the aperture and the top of the optical cavity.

FIG. 35 illustrates graphically the optical field profile 222 and refractive index profile 224 for the eleven λ/4 layer pair structure of Column 3B. The 40 nm thick reflective, conductive silver layer 198 has a refractive index profile 226. The 17 nm thick SiO$_2$ layer 209 has a refractive index profile 228. The 181 nm thick TiO$_2$ layer 202 has a refractive index profile 230, and the 16 nm thick Al$_{0.16}$GaAs layer 200 has a refractive index profile 220.

TABLE 3

|  | VCSEL With Metal Enhanced Upper Mirror (15 λ/4 pair upper DBR) Column 3A | VCSEL With Metal Enhanced Upper Mirror (11 λ/4 pair upper DBR) Column 3B |
|---|---|---|
| Upper λ/4 Pairs | 15 | 11 |
| Lower λ/4 Pairs | 35 | 35 |
| Threshold Gain (cm$^{-1}$) | 276.265 | 374.256 |
| Wavelength (nm) | 821.851 | 821.82 |
| External Efficiency (Total) | 0.319013 | 0.499923 |
| External Efficiency (Bottom) | 0.0942835 | 0.0654105 |
| External Efficiency (Top) | 0.22473 | 0.434512 |
| Round Trip Net Gain | 0.00280533 | 0.00304929 |
| Round Trip Net Loss | 0.00191039 | 0.00152488 |
| Round Trip Transmission | 0.000894938 | 0.00152411 |
| Transmission Down | 0.000264497 | 0.000199456 |
| Transmission Up | 0.000630442 | 0.00132495 |
| Active Region Thickness (nm) | 16.0844 | 16.0844 |
| Gain Enhancement Factor | 3.16363 | 2.53839 |
| Normalized Peak E$^2$ Field | 9470.77 | 9482.14 |
| Normalized E$^2$ Field at Active region | 8930.6 | 8942.97 |
| Normalized Top E$^2$ Field | 2.6734 | 7.45238 |
| Normalized Bottom E$^2$ Field | 1.1216 | 1.12186 |
| Nearest Subsurface Metal Peak | 300 | 300 |
| Surface-Peak Field Ratio | 0.031676411 | 0.105461425 |
| Intensity Enhancement | 23.83694351 | 79.36120238 |
| Top Surface Reflectivity | 0.999369558 | 0.99867505 |

Table 2, Columns 2A and 2B respectively provide the parameters for the structure under aperture 206 for eleven and fifteen λ/4 layer pairs 160, and FIG. 31 and FIG. 32 provide graphic representations of the optical field profiles and refractive index profiles for these structures, as described above.

In order to further enhance the efficiency of extraction of optical power from the small aperture VCSEL apparatus provided by the invention, the configuration of the aperture can be modified such that emission efficiency is enhanced. As described above, one presently preferred aperture configuration in accordance with the invention includes one or more protrusions in the surrounding conductive layer which extend into the aperture. A variety of aperture configurations in accordance with the present invention may be etched into the emission facet of a VCSEL device using conventional FIB or e-beam lithographic techniques.

Figure 36:
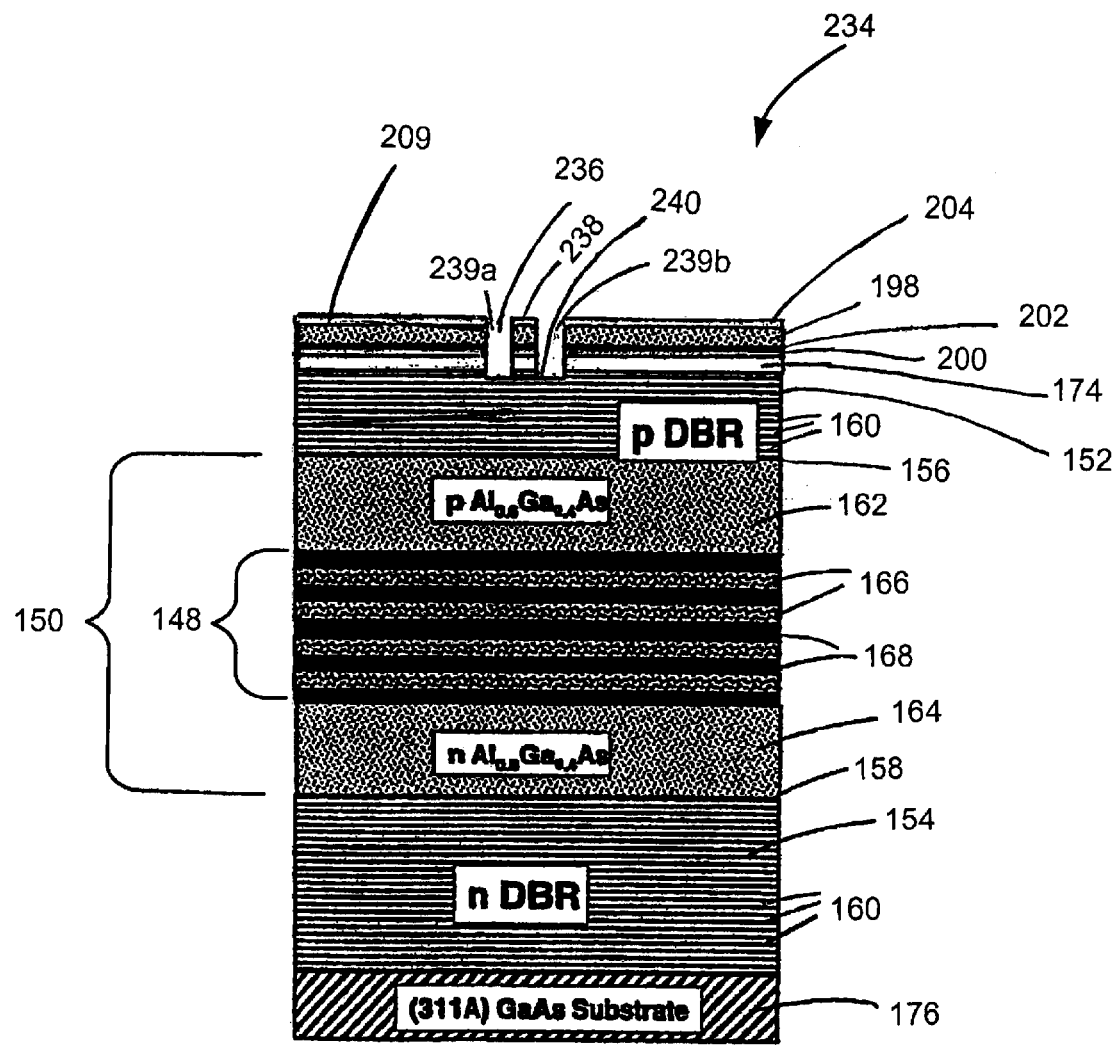
FIG. 36 is a schematic side elevation view in cross-section of an another preferred embodiment vertical cavity surface emitting laser in accordance with the present invention.

Referring now to FIG. 36, there is shown another embodiment VCSEL 234 is shown, wherein like reference numbers denote like parts. The VCSEL 234 comprises an aperture 236 which is structured and configured in the same manner of the aperture 18 described above and shown in FIG. 2. The aperture 236 includes a protrusion or tongue 238 which extends into the aperture 236 from the surrounding conductive layer 198, such that regions 239a, 239b are defined in the aperture. Aperture 236 is etched into emission facet 204 using a focused ion beam or other anisotropic etching technique, with the bottom 240 of aperture 236 nominally coinciding with the center of the TiO$_2$ layer 202, which is subject to the highest magnitude of electric field during laser operation, as noted above. The tongue or protrusion 238 includes the conductive metal layer 198 as well as the layers 202, 200 and 174 positioned beneath metal layer 198. In respects other than the configuration of aperture 236, the structure of VCSEL 234 is the same as described above for VCSEL 196.

As described above, the use of an aperture 236 surrounded by a conductive metal plane 198, with a protrusion 238 of the conductive metal plane into the aperture, provides good near field localization, together with a higher level of near field brightness than has previously been available in VCSEL devices. Preferably, the perimeter length of aperture 236 is tailored to be substantially at resonance with the output wavelength of laser 234 as noted above. Resonance effects here should take into consideration the particular semiconductor, oxide and metal materials of the VCSEL, which will generally modify the effective wavelength to satisfy the resonance condition. VCSEL devices offer a relatively high degree of intrinsic polarization, and aperture 236 is positioned to maximize the number of aperture edges which are substantially perpendicular to the polarization direction of the output of laser 236.

The aperture 236 may be structured and configured in the manner of the apertures shown in FIG. 11, FIG. 22, FIG. 23, FIG. 25 and FIG. 26, as described above. If the annular aperture of FIG. 26A is used in VCSEL 234, for example, the aperture 236 in emission face 209, would be annular in shape, with a central post or core 238 defined by the annular aperture 236. The structure of an annular aperture 236 and post 238 is conceptually analogous to the difference between a hollow coaxial metal waveguide, which has a well defined frequency or wavelength above (or below) which electromagnetic radiation evanesces rather than propagates, and a coaxial waveguide with two electrically isolated conductors, wherein electromagnetic radiation may propagate at arbitrarily low frequencies (long wavelengths). The annular aperture configuration provide two regions in the conductive layer 198 and emission face 204 that are electrically isolated from each other, and provides for creating an electrical dipole in the emission plane of the laser. Such an electric dipole is a much more efficient radiator of optical energy at a given wavelength than a simple aperture configuration, since the simple aperture provides for only one electrical potential in the emission plane of the aperture. In other words, the simple conducting aperture is an equipotential of the electric field. This effect can be important for apertures of subwavelength dimension, where, for simple apertures such as that shown in FIG. 1, evanescent fields which do not propagate beyond the aperture represent a substantial fraction of the total optical power, and the evanescent power fraction is strongly wavelength dependent.

The use of an annular aperture as described above is only exemplary. More generally, the conductive plane of the emission face may be partitioned into at least two regions which are electrically isolated from each other, and with at least one region in which the separation between the electrically isolated regions is much smaller than the emission wavelength, and which thereby provides for enhanced localized emission efficiency through the region of small separation. The shape of such isolated regions may be tailored to provide for further enhancement of the emission as a result of electromagnetic resonance effects within the isolated regions.

Accordingly, it will be seen that this invention provides a near field optical apparatus which provides high output power with effective near field localization. Although the description above contains many specificities, these should not be construed as limiting the scope of the invention but as merely providing an illustration of the presently preferred embodiment of the invention. Thus the scope of this invention should be determined by the appended claims and their legal equivalents.

What is claimed is:

1. A near field optical apparatus comprising:
   a conductive layer defining an aperture therein, said aperture having a perimeter;
   said conductive layer having at least one protrusion extending into said aperture at said perimeter, wherein said protrusion into said aperture is configured to produce a transmission mode with very high throughput.

2. The near field apparatus of claim 1, wherein said protrusion defines first and second regions in said aperture, said protrusion located between said first and second regions.

3. The near field apparatus of claim 2, wherein said first and second regions are elongated in a direction which is substantially parallel with a polarization direction of source light.

4. The near field optical apparatus of claim 1, wherein said aperture has a perimeter dimension which is substantially resonant with an output wavelength of light passing through said aperture.

5. The near field optical apparatus of claim 1, wherein said conductive plane includes first and second protrusions extending into said aperture, said first and second protrusions located on substantially opposite sides of said aperture.

6. The near field optical apparatus of claim 3, wherein first region comprises a first slot, said second region comprises a second slot, and said protrusion further defines a connecting region joined to said first and second slots.

7. The near field optical apparatus of claim 1, wherein said protrusion is electrically isolated from said conducting plane.

8. The near field optical apparatus of claim 5, wherein said first and second protrusions are electronically isolated from said conductive plane.

9. The near field optical apparatus of claim 1, wherein said aperture generally forms a C shape.

10. The near field optical apparatus of claim 1, wherein said aperture generally forms an H shape.

11. The near field optical apparatus of claim 1, wherein for said subwavelength aperture the wavelength of light of said light source is greater than the width of said aperture.

12. The near field optical apparatus of claim 1, wherein for said subwavelength aperture the wavelength of light of said light source is greater than half the width of said aperture.

13. A near field optical apparatus, comprising:
   (a) a light source;
   (b) a conductive plane proximate to said light source, said conductive plane having a subwavelength aperture therein positioned such that light from said light source passes through said aperture;
   (c) said conductive plane including at least one protrusion which extends into said aperture, wherein said protrusion into said aperture forms an aperture shape that produces very high light throughput.

14. The near field apparatus of claim 13, wherein said protrusion defines first and second regions in said aperture, and a localization aperture located between said first and second regions proximate said protrusion.

15. The near field apparatus of claim 14, wherein said first and second regions are elongated in a direction which is substantially parallel with a direction of polarization of said light source.

16. The near field optical apparatus of claim 13, wherein said aperture has a perimeter dimension which is substantially resonant with an output wavelength of said light source.

17. The near field optical apparatus of claim 13, wherein said conductive plane includes first and second protrusions extending into said aperture, said first and second protrusions located on substantially opposite sides of said aperture.

18. The near field optical apparatus of claim 15, wherein said first region comprises a first slot, said second region comprises a second slot, and said protrusion further defines a connecting region joined to said first and second slots, said connecting region defining a localization aperture.

19. The near field optical apparatus of claim 13, wherein said protrusion is electrically isolated from said conducting plane.

20. The near field optical apparatus of claim 17, wherein said first and second protrusions are electrically isolated from said conducting plane.

21. The near field optical apparatus of claim 13, wherein said light source is a semiconductor laser, and said conductive plane is a metal layer proximate to an emission facet of said semiconductor laser.

22. The near-field apparatus of claim 21, wherein said semiconductor laser further comprises:
   (a) a laser active region;
   (b) a fist reflective region adjacent a first side of said active region; and
   (c) a second reflective region adjacent a second side of said active region;
   (d) said metal layer positioned adjacent an outer surface of said first reflective region.

23. A semiconductor laser apparatus comprising an emission facet having a conductive surface, and conductive surface having an aperture therein, said conductive surface including at least one protrusion extending into said aperture, said at least one protrusion and said aperture configured to produce a transmission mode with very high throughput.

24. A near filed optical apparatus comprising a conductive plane having an aperture therein, said aperture including a plurality of spaced apart slots, and at least one connector region joined to each adjacent said spaced apart slot.

25. The near field optical apparatus of claim 24, wherein said aperture comprises:
   (a) a first slot of Length $L_1$;
   (b) a second slot of Length $L_2$; and
   (c) at least one connector region of width W, said connector region joined to said first slot and said second slot.

26. The near field optical apparatus of claim 25, wherein said length $L_1$ of said first slot is equal to said length $L_2$ of said second slot.

27. The near field optical apparatus of claim 25, wherein said first and second slots each have a width equal to said width W.

28. The near field optical apparatus of claim 25, wherein said connector region is centrally located with respect to said first and second slots.

29. The near field optical apparatus of claim 25 wherein said connector region is a symmetrically located with respect to said first and second slots.

30. The near field optical apparatus of claim 27, wherein said length $L_1$ of said first slot is greater than said width W, and said length $L_2$ of said second slot is greater than said width W.

31. The near field optical apparatus of claim 27, wherein length $L_1$ of said first slot is equal to said width W, and said length $L_2$ of said second slot is equal to said width W.

32. The near field optical apparatus of claim 28, wherein said first slot includes a first end, said second slot includes a first end, and said connector region is positioned adjacent said first ends of said first and second slots.

33. The near field optical apparatus of claim 28, wherein aperture comprises a first connector region and a second connector region, said first slot includes a first end and a second end, and said second slot includes a first end and a second end, said first connector region positioned adjacent said first ends of said first and second slots, said second connector region positioned adjacent said second ends of said first and second transverse slots.

34. A semiconductor laser apparatus, comprising:
(a) a laser active region;
(b) a first reflective region adjacent a first side of said active region;
(e) a second reflective region adjacent a second side of said active region;
(d) an emission face proximate to said first reflective region, said emission face including a reflective, conductive layer thereon; and
(e) said emission face including a subwavelength aperture extending through said reflective conductive layer and into at least a portion of said first reflective region, said reflective conductive layer including at least one protrusion which extends into said aperture, wherein said protrusion into said aperture is of sufficient size to produce a transmission mode with very high throughput.

35. The semiconductor laser apparatus of claim 34, wherein said aperture is smaller than a guide mode of said semiconductor laser.

36. The semiconductor laser apparatus of claim 34, wherein said first reflective region and said second reflective region each comprises a plurality of distributed Bragg mirrors.

37. The semiconductor laser apparatus of claim 36, wherein said semiconductor laser includes a first area under said aperture, and a second area surrounding said aperture, said first area under said aperture including a smaller number of said distributed Bragg reflector mirrors than said second area surrounding said aperture.

38. The semiconductor laser apparatus of claim 37, wherein said first area under said aperture defines a region of lower reflectivity and said second region surrounding said aperture defines a region of higher reflectivity.

39. The semiconductor laser apparatus of claim 34, further comprising a semiconductor contact layer positioned between said reflective conducting layer and said first reflective region.

40. The semiconductor laser apparatus of claim 39, further comprising an oxide layer positioned between the reflective conducting layer and said semiconductor contact layer.

41. A semiconductor laser comprising:
(a) a laser active region;
(b) an first conductivity type upper reflective region adjacent an upper side of said active region;
(c) a second conductivity type lower reflective region adjacent a lower side of side active region; and
(d) an emission facet adjacent said upper reflective region, and emission facet having a subwavelength aperture therein,
said aperture smaller than a guide mode of said semiconductor laser, said upper reflective region having at least one protrusion extending into said aperture, wherein said protrusion is of sufficient size to produce a transmission mode with very high throughput.

42. The semiconductor laser of claim 41, further comprising a reflective conductive layer on said emission facet.

43. The semiconductor laser of claim 42, further comprising a semiconductor contact layer located between said reflective conducting layer and said first conductivity type upper reflective region.

44. The semiconductor laser of claim 43, further comprising an oxide layer located between said reflective conducting layer and said semiconductor contact layer.

45. The semiconductor laser of claim 41, further comprising a first, lower reflectivity area under said aperture, and a second, higher reflectivity area surrounding said aperture.

46. The semiconductor laser of claim 45, wherein said first conductivity type upper reflective region comprises a plurality of p-doped quarter wave layer pairs, and said second conductivity type reflective region comprises a plurality of n-doped quarter wave layer pairs.

47. The semiconductor laser of claim 46, wherein said first, lower reflectivity area under said aperture includes a smaller number of p-doped quarter wave layers than said second, higher reflectivity area surrounding said aperture.

48. The semiconductor laser of claim 42, wherein said reflective conductive layer includes at least one protrusion which extends into said aperture.

* * * * *